US011916671B2

(12) United States Patent
Sheng et al.

(10) Patent No.: US 11,916,671 B2
(45) Date of Patent: Feb. 27, 2024

(54) METHODS FOR INTERLEAVED MAPPING

(71) Applicant: QUALCOMM Incorporated, San Diego, CA (US)

(72) Inventors: Hongsan Sheng, San Diego, CA (US); Subramanya P. N. Rao, Sunnyvale, CA (US); Aamod Khandekar, San Diego, CA (US); Yang Sun, San Diego, CA (US); Srujana Ellanki, San Jose, CA (US); Navaneet Reddy Danda, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 138 days.

(21) Appl. No.: 17/023,137

(22) Filed: Sep. 16, 2020

(65) Prior Publication Data

US 2021/0083803 A1 Mar. 18, 2021

Related U.S. Application Data

(60) Provisional application No. 62/902,337, filed on Sep. 18, 2019.

(51) Int. Cl.
*H04L 1/00* (2006.01)
*H04W 76/27* (2018.01)
(Continued)

(52) U.S. Cl.
CPC ...... *H04L 1/0071* (2013.01); *H03M 13/2707* (2013.01); *H03M 13/2778* (2013.01);
(Continued)

(58) Field of Classification Search
CPC ... H04L 1/0071; H04L 5/0048; H04L 5/0005; H04L 1/0043; H04L 1/0052;
(Continued)

(56) References Cited

U.S. PATENT DOCUMENTS

2011/0177822 A1* 7/2011 Takanashi ............... H04L 5/003
455/450
2012/0120888 A1 5/2012 Miao et al.
(Continued)

FOREIGN PATENT DOCUMENTS

WO WO-2019134487 A1 7/2019

OTHER PUBLICATIONS

Ericsson: "On VRB-to-PRB Mapping", 3GPP Draft; R1-1800795, 3GPP TSG-RAN WG1 AH 1801, on PRB-VRB Mapping, 3rd Generation Partnership Project (3GPP), Mobile Competence Centre, 650, Route Des Lucioles, F-06921 Sophia-Antipolis Cedex, France vol. RAN WG1, No. Vancouver, Canada, Jan. 22, 2018-Jan. 26, 2018, Jan. 12, 2018 (Jan. 12, 2018), XP051384485, pp. 1-2, Retrieved from the Internet:URL: http://www.3gpp.org/ftp/tsg%5Fran/WG1%5FRL1/TSGR1%5FAH/NR%5FAH%5F1801/Docs/ [retrieved on Jan. 12, 2018] the Whole Document.
(Continued)

*Primary Examiner* — Ian N Moore
*Assistant Examiner* — Sun Jong Kim
(74) *Attorney, Agent, or Firm* — Holland & Hart LLP

(57) ABSTRACT

Methods, systems, and devices for interleaved mapping are described. In some implementations, a transmitting device identifies a set of virtual resource blocks (VRBs) corresponding to at least one code block to be transmitted to a receiving device. The transmitting device may determine that a quantity of VRBs to be transmitted to the receiving device is different than a quantity of entries within a regular interleaving matrix. Thus, the transmitting device may map each of the VRBs to a physical resource block (PRB) according to an irregular interleaving matrix to generate at least one interleaved code block. The transmitting device may transmit the interleaved code block to the receiving device. The receiving device may receive the interleaved
(Continued)

code block and identify the PRBs associated with the interleaved code block. The receiving device may map each PRB within the interleaved code block to a VRB according to an irregular deinterleaving matrix.

22 Claims, 17 Drawing Sheets

(51) Int. Cl.
  *H03M 13/27* (2006.01)
  *H04W 72/04* (2023.01)
  *H04W 72/0453* (2023.01)
  *H04W 72/1263* (2023.01)

(52) U.S. Cl.
  CPC ....... *H04W 72/04* (2013.01); *H04W 72/0453* (2013.01); *H04W 72/1263* (2013.01); *H04W 76/27* (2018.02)

(58) Field of Classification Search
  CPC ............ H04L 1/0057; H03M 13/2707; H03M 13/2778; H03M 13/2789; H04W 76/27
  See application file for complete search history.

(56) References Cited

U.S. PATENT DOCUMENTS

| | | | |
|---|---|---|---|
| 2017/0142719 A1 | 5/2017 | Seo et al. | |
| 2019/0150118 A1* | 5/2019 | Nam | H04L 1/0071 370/329 |
| 2019/0386727 A1* | 12/2019 | Jeon | H04B 7/0695 |
| 2020/0068540 A1* | 2/2020 | Wang | H04L 5/0091 |
| 2020/0244420 A1* | 7/2020 | Wang | H04L 5/0094 |
| 2020/0344758 A1* | 10/2020 | Li | H04L 1/0071 |
| 2020/0382249 A1 | 12/2020 | Xing | |
| 2021/0000450 A1* | 1/2021 | Zhang | A61B 8/00 |
| 2021/0329634 A1* | 10/2021 | Kim | H04L 27/26 |

OTHER PUBLICATIONS

International Search Report and Written Opinion—PCT/US2020/051280—ISA/EPO—dated Dec. 18, 2020.

* cited by examiner

METHODS FOR INTERLEAVED MAPPING

CROSS REFERENCE

The present Application for Patent claims the benefit of U.S. Provisional Patent Application No. 62/902,337 by SHENG et al., entitled "METHODS FOR INTERLEAVED MAPPING," filed Sep. 18, 2019, assigned to the assignee hereof, and expressly incorporated by reference herein.

BACKGROUND

The following relates generally to wireless communications, and more specifically to methods for interleaved mapping.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM). A wireless multiple-access communications system may include a number of base stations or network access nodes, each simultaneously supporting communication for multiple communication devices, which may be otherwise known as user equipment (UE).

Some devices communicating wirelessly within a wireless communication system may employ interleaving. The interleaving may increase a frequency diversity for transmissions between the devices and may improve the reliability of communications between the devices. Transmissions that are not interleaved may experience comparatively less reliability.

SUMMARY

The present disclosure relates to methods, systems, devices, and apparatuses that support methods for interleaved mapping. Generally, the described techniques provide interleaving a set of virtual resource blocks (VRBs) according to an irregular interleaving matrix. In some cases, a transmitting device may identify a set of VRBs to transmit to a receiving device. The transmitting device may determine that a quantity of the VRBs may not be interleaved according to a regular (e.g., rectangular or square) matrix. The transmitting device may generate the irregular interleaving matrix by concatenating a regular matrix and a vector. The transmitter may map the VRBs to physical resource blocks (PRBs) by interleaving the VRBs according to the irregular interleaving matrix, thus generating one or more interleaved code blocks. The transmitter may transmit the interleaved code blocks to the receiving device, which may receive and identify the PRBs within the interleaved code blocks. The receiving device may map the PRBs to a set of VRBs according to an irregular deinterleaving matrix (for example, an inverse of the irregular interleaving matrix), which may act to deinterleave the VRBs interleaved according to the irregular interleaving matrix.

A method of wireless communication at a transmitting device is described. The method may include identifying a set of VRBs corresponding to one or more code blocks to be transmitted to a receiving device, mapping, for each VRB of the set of VRBs, the VRB to one of a set of PRBs according to an irregular interleaving matrix to generate interleaved code blocks, and transmitting an output signal to the receiving device based on the interleaved code block.

An apparatus for wireless communication at a transmitting device is described. The apparatus may include a processor, memory coupled with the processor, and instructions stored in the memory. The instructions may be executable by the processor to cause the apparatus to identify a set of VRBs corresponding to one or more code blocks to be transmitted to a receiving device, map, for each VRB of the set of VRBs, the VRB to one of a set of PRBs according to an irregular interleaving matrix to generate interleaved code blocks, and transmit an output signal to the receiving device based on the interleaved code block.

Another apparatus for wireless communication at a transmitting device is described. The apparatus may include means for identifying a set of VRBs corresponding to one or more code blocks to be transmitted to a receiving device, mapping, for each VRB of the set of VRBs, the VRB to one of a set of PRBs according to an irregular interleaving matrix to generate interleaved code blocks, and transmitting an output signal to the receiving device based on the interleaved code block.

A non-transitory computer-readable medium storing code for wireless communication at a transmitting device is described. The code may include instructions executable by a processor to identify a set of VRBs corresponding to one or more code blocks to be transmitted to a receiving device, map, for each VRB of the set of VRBs, the VRB to one of a set of PRBs according to an irregular interleaving matrix to generate interleaved code blocks, and transmit an output signal to the receiving device based on the interleaved code block.

Some examples of the method, apparatuses, and non-transitory computer-readable medium described herein may further include operations, features, means, or instructions for transmitting, to the receiving device, an indication of the irregular interleaving matrix.

Some examples of the method, apparatuses, and non-transitory computer-readable medium described herein may further include operations, features, means, or instructions for determining a quantity of VRBs of the set of VRBs, and generating the irregular interleaving matrix based on the determined quantity.

In some examples of the method, apparatuses, and non-transitory computer-readable medium described herein, generating the irregular interleaving matrix further may include operations, features, means, or instructions for concatenating a regular matrix and a vector to generate the irregular interleaving matrix, where the regular matrix corresponds to a first portion of VRBs of the set of VRBs, and the vector corresponds to a remaining portion of VRBs of the set of VRBs.

In some examples of the method, apparatuses, and non-transitory computer-readable medium described herein, the regular matrix includes a first number of rows and a first number of columns, and the vector includes a single column and a second number of rows less than the first number of rows.

In some examples of the method, apparatuses, and non-transitory computer-readable medium described herein, the regular matrix includes a first number of rows and a first number of columns, and the vector includes a single column and a second number of rows equal to the first number of rows.

Some examples of the method, apparatuses, and non-transitory computer-readable medium described herein may further include operations, features, means, or instructions for identifying an index corresponding to an entry of the irregular interleaving matrix associated with the VRB, where mapping the VRB to one of the set of PRBs may be based on the identified index.

In some examples of the method, apparatuses, and non-transitory computer-readable medium described herein, mapping the VRB to one of the set of PRBs according to the irregular interleaving matrix further may include operations, features, means, or instructions for identifying an index corresponding to an entry of the irregular interleaving matrix based on a column-first order, and mapping the VRB to one of the set of PRBs according to the identified index.

In some examples of the method, apparatuses, and non-transitory computer-readable medium described herein, mapping the VRB to one of the set of PRBs according to the irregular interleaving matrix further may include operations, features, means, or instructions for identifying an index corresponding to an entry of the irregular interleaving matrix based on a row-first order, and mapping the VRB to one of the set of PRBs according to the identified index.

In some examples of the method, apparatuses, and non-transitory computer-readable medium described herein, the set of PRBs spans a bandwidth part.

In some examples of the method, apparatuses, and non-transitory computer-readable medium described herein, the set of PRBs corresponds to resources allocated to the receiving device.

In some examples of the method, apparatuses, and non-transitory computer-readable medium described herein, the set of VRBs includes one or more resource block bundles, each resource block bundle including a set of VRBs of the set of VRBs.

In some examples of the method, apparatuses, and non-transitory computer-readable medium described herein, a quantity of resource block bundles of the set of VRBs and a quantity of entries in the irregular interleaving matrix may be a same quantity.

Some examples of the method, apparatuses, and non-transitory computer-readable medium described herein may further include operations, features, means, or instructions for transmitting, to the receiving device, a radio resource control (RRC) parameter indicating that the transmitting device may be to use interleaver mapping.

A method of wireless communication at a receiving device is described. The method may include receiving an input signal from a transmitting device, identifying, from the received input signal, a set of PRBs corresponding to one or more code blocks, and mapping, for each PRB of the set of PRBs, the PRB to one of a set of VRBs according to an irregular deinterleaving matrix to generate deinterleaved code blocks.

An apparatus for wireless communication at a receiving device is described. The apparatus may include a processor, memory coupled with the processor, and instructions stored in the memory. The instructions may be executable by the processor to cause the apparatus to receive an input signal from a transmitting device, identify, from the received input signal, a set of PRBs corresponding to one or more code blocks, and map, for each PRB of the set of PRBs, the PRB to one of a set of VRBs according to an irregular deinterleaving matrix to generate deinterleaved code blocks.

Another apparatus for wireless communication at a receiving device is described. The apparatus may include means for receiving an input signal from a transmitting device, identifying, from the received input signal, a set of PRBs corresponding to one or more code blocks, and mapping, for each PRB of the set of PRBs, the PRB to one of a set of VRBs according to an irregular deinterleaving matrix to generate deinterleaved code blocks.

A non-transitory computer-readable medium storing code for wireless communication at a receiving device is described. The code may include instructions executable by a processor to receive an input signal from a transmitting device, identify, from the received input signal, a set of PRBs corresponding to one or more code blocks, and map, for each PRB of the set of PRBs, the PRB to one of a set of VRBs according to an irregular deinterleaving matrix to generate deinterleaved code blocks.

Some examples of the method, apparatuses, and non-transitory computer-readable medium described herein may further include operations, features, means, or instructions for receiving, from the transmitting device, an indication of the irregular deinterleaving matrix.

Some examples of the method, apparatuses, and non-transitory computer-readable medium described herein may further include operations, features, means, or instructions for determining a quantity of PRBs of the set of PRBs, and generating the irregular deinterleaving matrix based on the determined quantity of PRBs.

In some examples of the method, apparatuses, and non-transitory computer-readable medium described herein, generating the irregular deinterleaving matrix further may include operations, features, means, or instructions for concatenating a regular matrix and a vector to generate the irregular deinterleaving matrix, where the regular matrix corresponds to a first number of PRBs of the set of PRBs, and the vector corresponds to a remaining portion of PRBs of the set of PRBs.

In some examples of the method, apparatuses, and non-transitory computer-readable medium described herein, the regular matrix includes a first number of rows and a first number of columns, and the vector includes a single column and a second number of rows less than the first number of rows.

In some examples of the method, apparatuses, and non-transitory computer-readable medium described herein, the regular matrix includes a first number of rows and a first number of columns, and the vector includes a single column and a second number of rows equal to the first number of rows.

Some examples of the method, apparatuses, and non-transitory computer-readable medium described herein may further include operations, features, means, or instructions for identifying an index corresponding to an entry of the irregular deinterleaving matrix associated with the PRB, where mapping the PRB to one of the set of VRBs may be based on the identified index.

In some examples of the method, apparatuses, and non-transitory computer-readable medium described herein, mapping the PRB to one of the set of VRBs according to the irregular deinterleaving matrix further may include operations, features, means, or instructions for identifying an index corresponding to an entry of the irregular deinterleaving matrix based on a column-first order, and mapping the PRB to one of the set of VRBs according to the identified index.

In some examples of the method, apparatuses, and non-transitory computer-readable medium described herein, mapping the PRB to one of the set of VRBs according to the irregular deinterleaving matrix further may include operations, features, means, or instructions for identifying an index corresponding to an entry of the irregular deinterleaving matrix based on a row-first order, and mapping the PRB to one of the set of VRBs according to the identified index.

In some examples of the method, apparatuses, and non-transitory computer-readable medium described herein, the set of PRBs spans a bandwidth part.

In some examples of the method, apparatuses, and non-transitory computer-readable medium described herein, the set of PRBs corresponds to resources allocated to the receiving device.

In some examples of the method, apparatuses, and non-transitory computer-readable medium described herein, the set of VRBs includes one or more resource block bundles, each resource block bundle including a set of VRBs of the set of VRBs.

In some examples of the method, apparatuses, and non-transitory computer-readable medium described herein, a quantity of resource block bundles of the set of VRBs and a quantity of entries in the irregular deinterleaving matrix may be a same quantity.

Some examples of the method, apparatuses, and non-transitory computer-readable medium described herein may further include operations, features, means, or instructions for receiving, from the transmitting device, a radio resource control parameter indicating that the transmitting device may be to use interleaver mapping.

DETAILED DESCRIPTION

Figure 1:
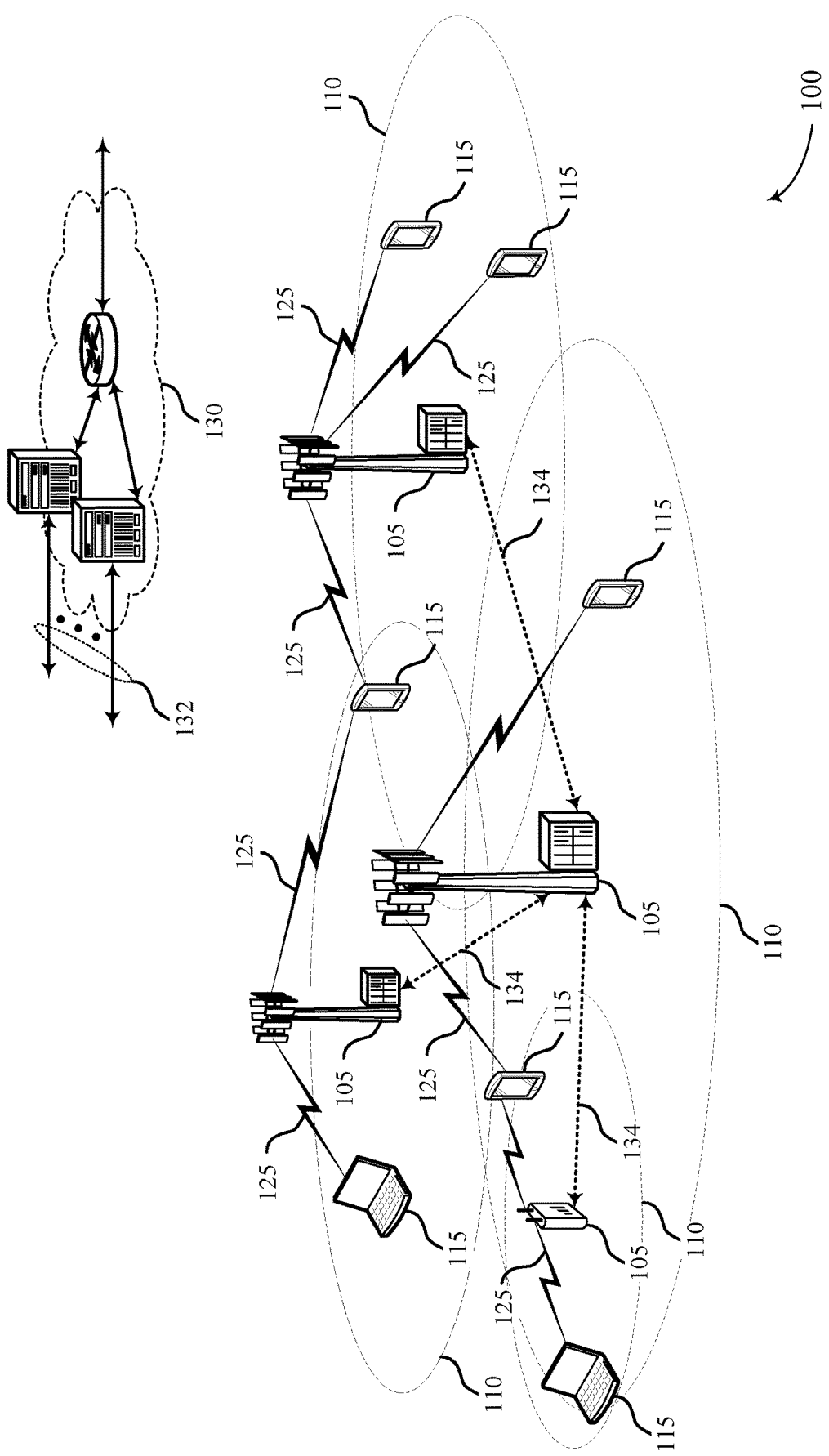
FIG. 1 illustrates an example of a system for wireless communication that supports methods for interleaved mapping in accordance with aspects of the present disclosure.

In some wireless communications systems, a transmitting device may employ interleaving to map a set of virtual resource blocks (VRBs) to a set of physical resource blocks (PRBs) to be transmitted to a receiving device. The transmitting device may achieve interleaving by mapping the set of VRBs to the set of PRBs according to an interleaving matrix. Increasing the dimensions (e.g., a number of rows) of the interleaving matrix may increase the frequency diversity achieved by the interleaving. For example, mapping the set of VRBs to the set of PRBs according to an interleaving matrix with two rows may achieve less frequency diversity than mapping the set of VRBs to the set of PRBs according to an interleaving matrix with eight rows. When the transmitting device maps the VRBs to the set of PRBs according to the interleaving matrix, the transmitting may determine a position for a bundle of VRBs (e.g., within the set of VRBs) within the PRBs according to an entry within the interleaving matrix. In some cases, the quantity of entries within the interleaving matrix (e.g., based on the number of rows and the number of columns of the interleaving matrix) may be less than the quantity of VRB bundles within the set of VRBs. In some cases, the transmitting device may not interleave the VRB bundles that do not fit within the dimensions of the interleaving matrix. However, this may result in low frequency diversity for the VRB bundles.

In some other cases, the transmitting device may use and/or generate an irregular interleaving matrix so that a quantity of the entries within the irregular interleaving matrix is equal to the quantity of VRB bundles. Thus, the transmitting device may interleave each of the VRB bundles when mapping the VRB bundles to the set of PRB bundles. This may increase the frequency diversity of the transmission, particularly by ensuring that each of the VRB bundles are interleaved. The transmitting device may generate the irregular interleaving matrix by concatenating a regular (e.g., rectangular) matrix with a vector. The transmitting device may map each VRB to a PRB according to the irregular interleaving matrix to generate one or more interleaved code blocks. The transmitting device may transmit the interleaved code blocks to the receiving device. Additionally, the transmitting device may transmit an indication to the receiving device that the transmitting device is using interleaving, such that the one or more code blocks are interleaved. In some instances, the transmitting device may also transmit an indication of the irregular interleaving matrix.

The receiving device may receive the interleaved code blocks and determine a set of PRBs from the interleaved code blocks. The receiving device may then map the set of PRBs to a set of VRBs according to an irregular deinterleaving matrix. In some cases, the irregular deinterleaving matrix may deinterleave VRBs previously interleaved according to the irregular interleaving matrix used by the transmitting device to map the set of VRBs to the set of PRBs.

Aspects of the disclosure are initially described in the context of a wireless communications system. Aspects of the disclosure are then described in the context of mapping configurations and a process flow. Aspects of the disclosure are further illustrated by and described with reference to apparatus diagrams, system diagrams, and flowcharts that relate to methods for interleaved mapping.

FIG. 1 illustrates an example of a wireless communications system 100 that supports methods for interleaved mapping in accordance with aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, an LTE-A Pro network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation NodeB or giga-NodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions from a base station 105 to a UE 115. Downlink transmissions may also be called forward link transmissions while uplink transmissions may also be called reverse link transmissions.

The geographic coverage area 110 for a base station 105 may be divided into sectors making up a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A/LTE-A Pro or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1, N2, N3, or other interface). Base stations 105 may communicate with one another over backhaul links 134 (e.g., via an X2, Xn, or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that may be capable of tolerating interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a carrier aggregation configuration in conjunction with component carriers operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving device is equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g., synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in in part on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions. In some examples a receiving device may use a single receive beam to receive along a single beam direction (e.g., when receiving a data signal). The single receive beam may be aligned in a beam direction determined based at least in part on listening according to different receive beam directions (e.g., a beam direction determined to have a highest signal strength, highest signal-to-noise ratio, or otherwise acceptable signal quality based at least in part on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use hybrid automatic repeat request (HARD) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30{,}720{,}000$ seconds. Time intervals of a communications resource may be organized according to radio frames each having a duration of 10 milliseconds (ms), where the frame period may be expressed as $T_f=307{,}200\ T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases, a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an evolved universal mobile telecommunication system terrestrial radio access (E-UTRA) absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as orthogonal frequency division multiplexing (OFDM) or discrete Fourier transform spread OFDM (DFT-S-OFDM)).

The organizational structure of the carriers may be different for different radio access technologies (e.g., LTE, LTE-A, LTE-A Pro, NR). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a predefined portion or range (e.g., set of subcarriers or RBs) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs 115 that support simultaneous communications via carriers associated with more than one different carrier bandwidth.

Wireless communications system 100 may support communication with a UE 115 on multiple cells or carriers, a feature which may be referred to as carrier aggregation or multi-carrier operation. A UE 115 may be configured with multiple downlink component carriers and one or more uplink component carriers according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other component carriers, which may include use of a reduced symbol duration as compared with symbol durations of the other component carriers. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz, etc.) at reduced symbol durations (e.g., 16.67 microseconds). A TTI in eCC may consist of one or multiple symbol periods. In some cases, the TTI duration (that is, the number of symbol periods in a TTI) may be variable.

Wireless communications system 100 may be an NR system that may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across the frequency domain) and horizontal (e.g., across the time domain) sharing of resources.

In wireless communications system 100, a transmitting device (e.g., a base station 105, a UE 115) may employ interleaving to map a set VRBs to a set of PRBs to be transmitted to a receiving device (e.g., a base station 105, a UE 115). The transmitting device may achieve interleaving by mapping the set of VRBs to the set of PRBs according to an interleaving matrix. Increasing the dimensions (e.g., a number of rows) of the interleaving matrix may increase the frequency diversity achieved by the interleaving. For example, mapping the set of VRBs to the set of PRBs according to an interleaving matrix with two rows may achieve less frequency diversity than mapping the set of VRBs to the set of PRBs according to an interleaving matrix with eight rows. When the transmitting device maps the VRBs to the set of PRBs according to the interleaving matrix, the transmitting may determine a position for a group of bundle of VRBs (e.g., within the set of VRBs) within the PRBs according to an entry within the interleaving matrix. Each bundle (e.g., of VRBs or PRBs) includes a set of resource blocks that may be contiguous within a frequency domain. In some cases, the quantity of entries within the interleaving matrix (e.g., based on the number of rows and the number of columns of the interleaving matrix) may be less than the quantity of VRB bundles within the set of VRBs. In some cases, the transmitting device may not interleave the VRB bundles that do not fit within the dimensions of the interleaving matrix. However, this may result in low frequency diversity for the VRB bundles.

The transmitting device may determine to generate an irregular interleaving matrix so that a quantity of the entries within the irregular interleaving matrix is equal to the quantity of VRB bundles. Thus, the transmitting device may interleave each of the VRB bundles when mapping the VRB bundles to the set of PRB bundles. This may increase the frequency diversity of the transmission, particularly by ensuring that each of the VRB bundles are interleaved. The transmitting device may generate the irregular interleaving matrix by concatenating a regular (e.g., rectangular) matrix with a vector. The transmitting device may map each VRB to a PRB according to the irregular interleaving matrix to generate one or more interleaved code blocks. The transmitting device may transmit the interleaved code blocks to the receiving device. Additionally, the transmitting device may transmit an indication to the receiving device that the one or more code blocks is interleaved. In some instances, the transmitting device may also transmit an indication of the irregular interleaving matrix.

The receiving device may receive the interleaved code blocks and determine a set of PRBs within the interleaved code blocks. The receiving device may then map the set of PRBs to a set of VRBs according to an irregular deinterleaving matrix. In some cases, the irregular deinterleaving matrix may deinterleave the VRBs mapped to the PRBs by the irregular interleaving matrix used by the transmitting device to map the set of VRBs to the set of PRBs.

Figure 2:
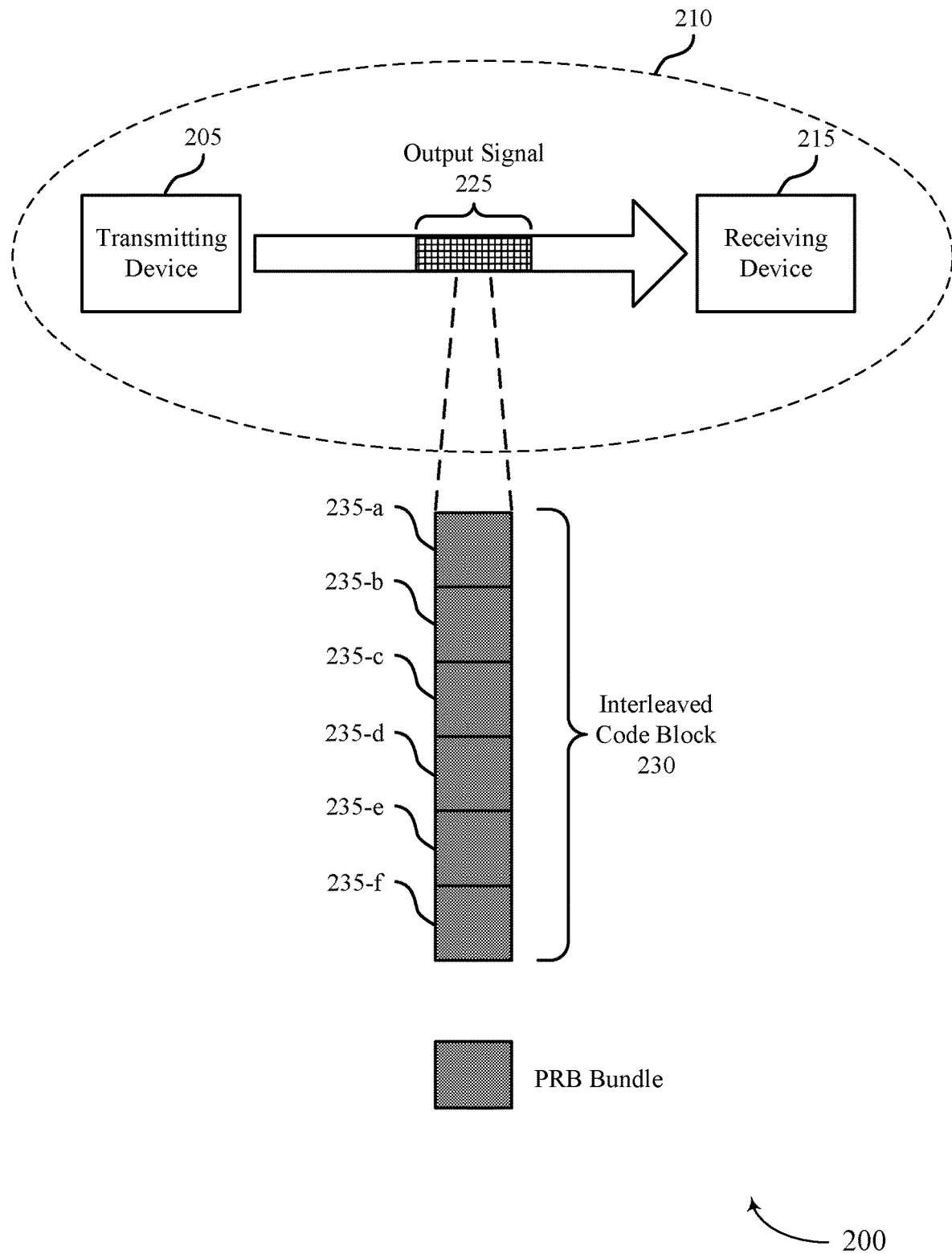
FIG. 2 illustrates an example of a system for wireless communication that supports methods for interleaved mapping in accordance with aspects of the present disclosure.

FIG. 2 illustrates an example of a wireless communications system 200 that supports methods for interleaved mapping in accordance with aspects of the present disclosure. Wireless communications system 200 may implement aspects of wireless communications system 100. For instance, wireless communications system 200 may include a transmitting device 205 and a receiving device 215, which may each include aspects of base stations 105 or UEs 115 as described with reference to FIG. 1. The wireless communications system 200 may also include a geographic coverage area 210 which may include features described with reference to geographic coverage areas 110 within FIG. 1. As described above, the transmitting device 205 may transmit an output signal 225 including one or more interleaved code blocks 230 to the receiving device 215.

The transmitting device 205 may identify a set of VRBs to transmit to the receiving device 215. The set of VRBs may contain a quantity of VRB bundles, where each VRB bundle includes more than one VRB (e.g., two VRBs, three VRBs, four VRBs). For example, the transmitting device 205 may identify six VRB bundles to transmit to the receiving device 215. In some cases, the transmitting device 205 may identify a quantity of VRB bundles that are allocated for communications between the transmitting device 205 and the receiving device 215. Each VRB bundle may have an associated index indicating a position of the VRB bundle (e.g., with respect to other VRB bundles). The set of VRBs may be contiguous or non-contiguous depending on a type of the resource block allocations. For example, in 5G NR, downlink resource allocation in frequency domain Type 1 resource allocations may correspond to a set of contiguous VRB bundles while downlink resource allocation in frequency domain Type 0 resource allocations correspond to non-contiguous VRB bundles.

Table 1, shown below, illustrates two example resource block allocations based on a type of resource block allocation, where the resource block allocations are indicated by a VRB bundle index. For example, the transmitting device 205 may identify that the resources allocated for communications with the receiving device 215 may be Type 1 resource allocations. Here, the transmitting device 205 may identify ten VRB bundles associated with VRB bundle indices eight through seventeen. In another example, the transmitting device 205 may identify that the resources allocated for communications with the receiving device 215 may be Type 0 resource allocations. Here, the transmitting device 205 may identify ten VRB bundles associated with VRB bundle indices indicated below according to Table 1. The transmitting device 205 may further assign a VRB bundle identifier (e.g., an assigned index) to each of the allocated VRB bundles.

TABLE 1

| Example Resource Allocation Types | | | | | | | | | |
|---|---|---|---|---|---|---|---|---|---|
| Type 1 | 8 | 9 | 10 | 11 | 12 | 13 | 14 | 15 | 16 | 17 |
| Type 0 | 2 | 3 | 6 | 7 | 16 | 17 | 18 | 19 | 20 | 21 |
| VRB Identifier | 0 | 1 | 2 | 3 | 4 | 5 | 6 | 7 | 8 | 9 |

The transmitting device 205 may map the quantity of VRB bundles to the set of PRB bundles 235 according to an interleaving matrix. The interleaving matrix may have a defined dimension (e.g., a defined number of rows, a defined number of columns). The size of the defined dimension of the matrix may correspond to the frequency diversity achieved by mapping VRB bundles to PRB bundles 235 according to the interleaving matrix. Based on a quantity of VRBs (e.g., the quantity of VRB bundles) to be interleaved, the transmitting device 205 may adapt a different dimension of the interleaving matrix. For example, if the quantity of rows within the interleaving matrix is defined to be five and the quantity of VRB bundles to be interleaved is 15, the transmitting device 205 may generate an interleaving matrix with five rows and three columns.

The quantity of VRB bundles to be mapped to PRB bundles 235 may not be a multiple of the defined dimension of the interleaving matrix. For example, the interleaving matrix may be defined to have three columns while the quantity of VRB bundles is eight. If the transmitting device 205 generates a regular (e.g., rectangular, square) interleaving matrix with three columns and two rows, the regular interleaving matrix may include six entries. Here, there may be two VRB bundles that are not interleaved and thus are transmitted with less frequency diversity. Additionally or alternatively, if the transmitting device 205 generates a regular interleaving matrix with three columns and three rows, there may be nine entries within the regular interleaving matrix. Here, there may be one entry within the regular interleaving matrix with no corresponding VRB bundle. In this instance, the transmitting device 205 may generate one dummy or placeholder VRB bundle so that the total number of VRB bundles equals the quantity of entries within the regular interleaving matrix. By adding a placeholder VRB bundle, the transmitting device 205 may utilize the regular interleaving matrix to interleave all of the VRB bundles (including the additional placeholding VRB).

Table 2, shown below, illustrates an example of the transmitting device 205 generating a placeholder (e.g., dummy or null) VRB bundle. The placeholder VRB bundle may not correspond to an existing VRB bundle, and is thus illustrated as 'NA' as opposed to an index corresponding to an existing VRB bundle. In this example, the interleaving matrix may have four rows and three columns, or twelve entries while the number of existing VRB bundles is only ten. As a result, the transmitting device 205 may generate the placeholding VRB so that the quantity of entries within the interleaving matrix equals the number of VRB bundles.

TABLE 2

Example Resource Allocation Types

| Type 1 | 8 | 9 | 10 | 11 | 12 | 13 | 14 | 15 | 16 | 17 | Na | Na |
|---|---|---|---|---|---|---|---|---|---|---|---|---|
| Type 0 | 2 | 3 | 6 | 7 | 16 | 17 | 18 | 19 | 20 | 21 | Na | Na |
| VRB Identifier | 0 | 1 | 2 | 3 | 4 | 5 | 6 | 7 | 8 | 9 | 10 | 11 |

The transmitting device 205 may interleave the VRB bundles using the regular interleaving matrix by mapping the VRB identifier (e.g., an assigned index) to the regular interleaving matrix according to a first order (e.g., row-first order, column-first order) and reading the PRB identifier from the regular interleaving matrix according to a different order (e.g., a column-first order, a row-first order). Table 3, shown below, illustrates an example regular interleaving matrix where the VRB identifier is mapped to the regular interleaving matrix according to a row-first order. That is, consecutive VRB identifiers are written to the first row of the regular interleaving matrix, then the second row, etc. Here, the assigned VRB bundle indices '10' and '11' correspond to the placeholder VRB bundles.

TABLE 3

Example Regular Interleaving Matrix

|  | Column 1 | Column 2 | Column 3 |
|---|---|---|---|
| Row 1 | 0 | 1 | 2 |
| Row 2 | 3 | 4 | 5 |
| Row 3 | 6 | 7 | 8 |
| Row 4 | 9 | 10 | 11 |

Table 4, shown below, illustrates an example mapping between the VRB bundle assigned indices and the PRB bundle 235 assigned indices based on the regular interleaving matrix illustrated in Table 3.

TABLE 4

Example VRB Bundle to PRB Bundle Index Mapping

| VRB Bundle Index | 0 | 1 | 2 | 3 | 4 | 5 | 6 | 7 | 8 | 9 | 10 | 11 |
|---|---|---|---|---|---|---|---|---|---|---|---|---|
| PRB Bundle Index | 0 | 3 | 6 | 9 | 1 | 4 | 7 | 10 | 2 | 5 | 8 | 11 |

Table 4 may be rewritten and reorganized to demonstrate a PRB bundle 235 to VRB bundle index mapping. Table 5, shown below, illustrates the PRB bundle 235 to VRB bundle index mapping.

TABLE 5

Example PRB Bundle to VRB Bundle Index Mapping

| PRB Bundle Index | 0 | 1 | 2 | 3 | 4 | 5 | 6 | 7 | 8 | 9 | 10 | 11 |
|---|---|---|---|---|---|---|---|---|---|---|---|---|
| VRB Bundle Index | 0 | 4 | 8 | 1 | 5 | 9 | 2 | 6 | 10 | 3 | 7 | 11 |

After mapping the VRB bundle assigned indices to PRB bundle 235 assigned indices (e.g., identifiers), the transmitting device 205 may utilize a bit map to identify the placeholder VRB bundles. An example VRB bundle bitmap is shown below in Table 6. Here, a logic value '0' indicates that the VRB bundle is a placeholder VRB bundle.

TABLE 6

Example VRB Bitmap

| VRB Bitmap | 1 | 1 | 1 | 1 | 1 | 1 | 1 | 1 | 0 | 1 | 1 | 0 |
|---|---|---|---|---|---|---|---|---|---|---|---|---|

The transmitting device 205 may shrink the number of PRB bundles 235 and move VRB bundle indices from higher indices to lower indices where there is a placeholder VRB bundle. Table 7, shown below, illustrates the shrunken VRB bundle indices.

TABLE 7

Shrunken VRB Indices

| Shrunken VRB Index | 0 | 4 | 8 | 1 | 5 | 9 | 2 | 6 | 3 | 7 | Na | Na |
|---|---|---|---|---|---|---|---|---|---|---|---|---|

The transmitting device 205 may then use a lookup table to map the VRB bundle index for a given PRB bundle index based on the type of resources allocated. Table 8, shown below, illustrates an example mapping from PRB bundles 235 to VRB bundles for Type 1 resource allocation.

TABLE 8

Example PRB bundle mapping for Type 1

| Type 1 PRB Bundle Index | 8 | 9  | 10 | 11 | 12 | 13 | 14 | 15 | 16 | 17 |
|---|---|---|---|---|---|---|---|---|---|---|
| VRB Bundle Index        | 8 | 12 | 16 | 9  | 13 | 17 | 10 | 14 | 11 | 15 |

Table 9, shown below, illustrates an example mapping from PRB bundles 235 to VRB bundles for Type 0 resource allocation.

TABLE 9

Example PRB bundle mapping for Type 0

| Type 0 PRB Bundle Index | 2 | 3  | 6  | 7  | 16 | 17 | 18 | 19 | 20 | 21 |
|---|---|---|---|---|---|---|---|---|---|---|
| VRB Bundle Index        | 8 | 11 | 14 | 16 | 9  | 12 | 15 | 17 | 10 | 13 |

The transmitting device 205 may then sort Tables 8 or 9 (e.g., depending on whether the resource allocation is a Type 1 or a Type 0) to determine a mapping between the identified VRB bundles and the PRB bundles 235. Table 10, shown below, illustrates an example mapping from VRB bundles to PRB bundles 235 for Type 1 resource allocation.

TABLE 10

Example PRB bundle mapping for Type 1

| Type 1 VRB Bundle Index | 8 | 9  | 10 | 11 | 12 | 13 | 14 | 15 | 16 | 17 |
|---|---|---|---|---|---|---|---|---|---|---|
| PRB Bundle Index        | 8 | 11 | 14 | 16 | 9  | 12 | 15 | 17 | 10 | 13 |

Table 11, shown below, illustrates an example mapping from VRB bundles to PRB bundles 235 for Type 0 resource allocation.

TABLE 11

Example PRB bundle mapping for Type 0

| Type 0 VRB Bundle Index | 2 | 3 | 6  | 7  | 16 | 17 | 18 | 19 | 20 | 21 |
|---|---|---|---|---|---|---|---|---|---|---|
| PRB Bundle Index        | 2 | 7 | 18 | 20 | 3  | 16 | 19 | 21 | 6  | 17 |

In some other examples, the transmitting device 205 may generate an irregular interleaving matrix with a same quantity of entries as the number of VRB bundles. That is, the generating dummy VRB bundles may introduce several additional processing steps to the transmitting device 205 to map the VRB bundles to the PRB bundles 235. Generating an interleaving matrix with a same quantity of entries as existing VRB bundles may decrease an amount of processing necessary to map the VRB bundles to the PRB bundles 235. For example, the interleaving matrix may be defined to have four rows and the transmitting device 205 may identify six VRB bundles to transmit to the receiving device 215. Here, the transmitting device 205 may concatenate a matrix with the defined dimension (e.g., a matrix with one column and four rows) and a vector (e.g., with one column and two rows) to generate an irregular interleaving matrix with a same quantity of entries as the quantity of VRB bundles.

In either example, the transmitting device 205 may map each of the VRB bundles to one of the PRB bundles 235 to generate the interleaved code block 230. In some cases, the PRB bundles 235 may span an entire bandwidth part. In some other cases, the PRB bundles 235 may span frequency resources allocated for communications between the transmitting device 205 and the receiving device 215, which frequency resources may be a portion (e.g., a subset of frequency resources) of the bandwidth part. The interleaved code block 230 may include a set of interleaved VRBs mapped to a set of PRB bundles 235. Additionally or alternatively, the output signal 225 may include more than one interleaved code block 230. Here, the more than one interleaved code blocks 230 may each include sets of VRBs mapped to a set of PRB bundles 235. The transmitting device 205 may transmit the interleaved code block 230 within the output signal 225 to the receiving device 215. The transmitting device 205 may additionally transmit an indication of the interleaved code block 230. For example, the transmitting device 205 may transmit a radio resource control (RRC) parameter indicating that the transmitting device 205 may use interleaving, such that the receiving device 215 expects output signal 225 to include one or more interleaved code blocks 230. Additionally or alternatively, the transmitting device 205 may indicate the interleaving matrix to the receiving device 215.

The receiving device 215 may receive the output signal 225 and determine the sets of PRB bundles 235 included within the output signal 225. In some cases, the receiving device 215 may determine the PRB bundles 235 based on receiving the RRC parameter from the transmitting device 205 indicating the interleaved code blocks 230. The receiving device 215 may deinterleave the PRB bundles 235 according to a deinterleaving matrix. In some cases the deinterleaving matrix may deinterleave the PRB bundles 235 interleaved according to the interleaving matrix used by the transmitting device 205 to map the VRB bundles to the PRB bundles 235.

Figure 3:
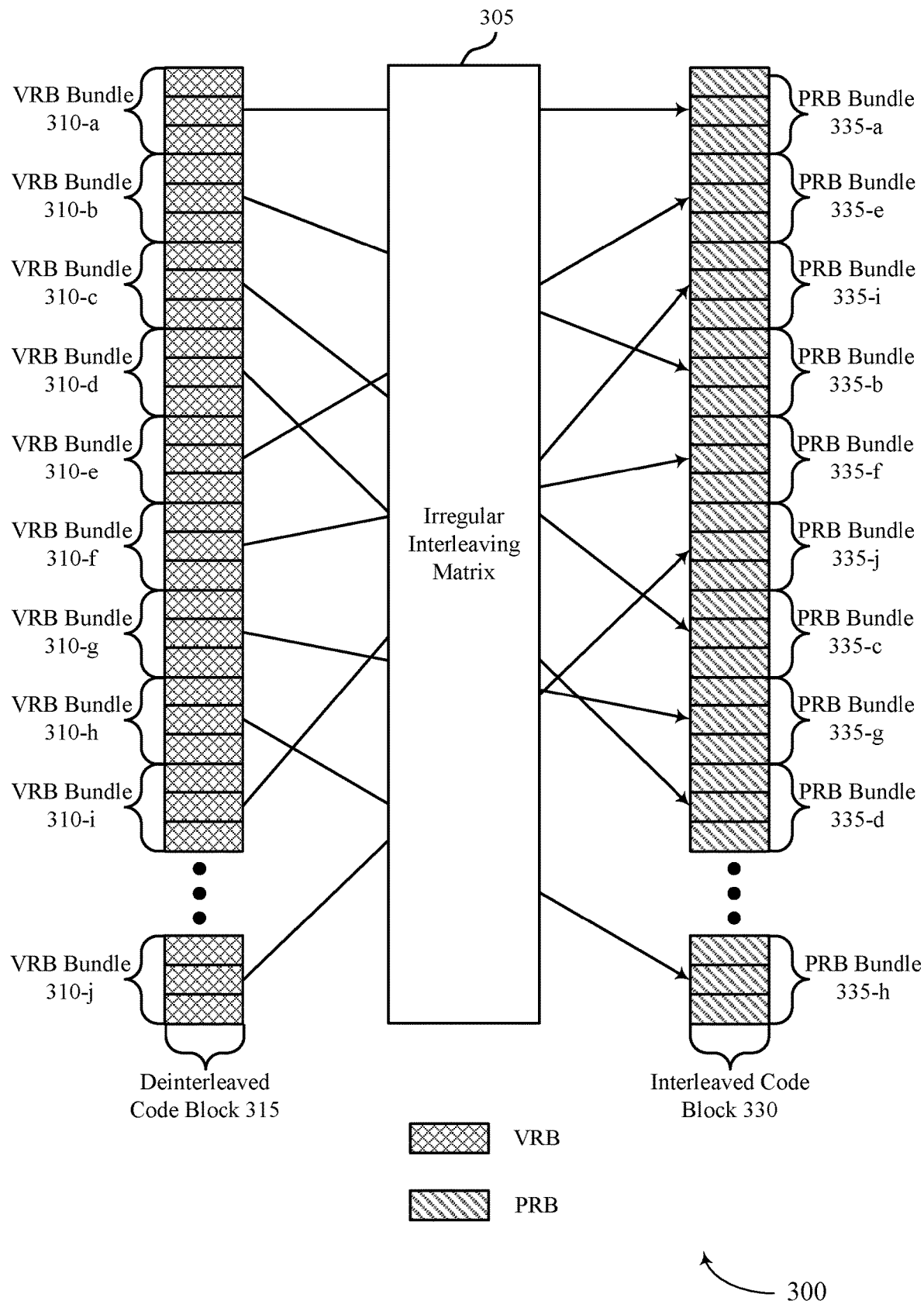
FIGS. 3 and 4 illustrate examples of mapping configurations that support methods for interleaved mapping in accordance with aspects of the present disclosure.

FIG. 3 illustrates an example of a mapping scheme 300 that supports methods for interleaved mapping in accordance with aspects of the present disclosure. Mapping scheme 300 may implement aspects of wireless communications system 100 and wireless communications system 200. For instance, mapping scheme 300 may include interleaved code block 330 and PRB bundles 335, which may be examples of the interleaved code block and PRB bundles, respectively, as described with reference to FIG. 2. The mapping scheme 300 may also include VRB bundles 310 and irregular interleaving matrix 305. As described above, a transmitting device (e.g., a transmitting device 205) may map the VRB bundles 310 to the PRB bundles 335 according to the irregular interleaving matrix 305 to generate one or more interleaved code blocks 330. Here, VRB bundle 310-*a* is mapped to PRB bundle 335-*a*, VRB bundle 310-*b* to PRB bundle 335-*b*, etc. The transmitting device may further transmit the one or more interleaved code blocks 330 to a receiving device.

The transmitting device may determine the VRB bundles 310 to be transmitted to a receiving device. Here, the transmitting device may determine that VRB bundles 310-*a* through 310-*j* are to be transmitted to the receiving device. Each of the VRB bundles 310 may include more than one VRB. Here, each of the VRB bundles 310 includes three VRBs, a VRB bundle 310 may include more VRBs or less VRBs. In some cases, each of the VRBs within a VRB bundle 310 may be consecutive VRBs in the frequency domain. The VRB bundles 310 may make up one or more deinterleaved code blocks 315 to be transmitted to the receiving device.

The transmitting device may determine that a quantity of the VRB bundles 310 to be transmitted to a receiving device is not a multiple of a defined dimension of the interleaving matrix (e.g., the irregular interleaving matrix 305). For example, the irregular interleaving matrix 305 may be defined to have four rows and the transmitting device determines that there are ten VRB bundles 310 to be transmitted to the receiving device. In another example, the irregular interleaving matrix 305 may be defined to have three rows and the transmitting device determines that there are 11 VRB bundles 310 to be transmitted to the receiving device. The transmitting device may generate the irregular interleaving matrix 305 to map each of the VRB bundles 310 to a PRB bundle 335. The transmitting device may generate the irregular interleaving matrix 305 by concatenating a regular matrix (e.g., a rectangular matrix) including the defined dimension and a vector.

In the example that the interleaving matrix has a defined dimension indicating a number of rows (e.g., a number of rows R), the transmitting device may first determine a quantity of columns for the irregular interleaving matrix 305 as shown below with reference to Equation 1:

$$C = \text{ceil}\left(\frac{N_{bundle}}{R}\right) \quad (1)$$

Here, R may be the defined number of rows within the interleaving matrix and N bundle may be the quantity of VRB bundles 310 to be transmitted to the receiving device. For example, if there are ten VRB bundles 310 and the defined number of rows of the irregular interleaving matrix 305 is four, the transmitting device may determine that the number of columns is three according to Equation 2:

$$C = \text{ceil}\left(\frac{10}{4}\right) \quad (2)$$

The transmitting device may generate the irregular interleaving matrix 305 by concatenating a regular (e.g., rectangular matrix) containing R rows and C-1 columns and a vector containing $R_{prime}$ rows and one column (e.g., a vector including $R_{prime}$ elements), where $R_{prime}$ is defined according to Equation 3:

$$R_{prime} = N_{bundle} - R*(C-1) \quad (3)$$

The transmitting device may map the VRB bundles 310 to the irregular interleaving matrix 305 according to an index associated with the VRB bundles 310. The transmitting device may assign indices to the VRB bundles 310 according to a frequency order (e.g., in order of ascending frequency, in order of decreasing frequency). For example, VRB bundle 310-$a$ may be assigned index '0' while VRB bundle 310-$b$ may be assigned an index '1'. In some cases, each of the VRB bundles 310 (and corresponding PRB bundles 335) are consecutive in the frequency domain (e.g., a type 1 VRB). In some other cases, each of the VRB bundles 310 may not be consecutive in the frequency domain (e.g., a type 0 VRB). Here, some of the VRB bundles 310 may be consecutive in the frequency domain (e.g., VRB bundle 310-$f$ and VRB bundle 310-$g$ may be consecutive in the frequency domain) while other VRB bundles 310 may not be consecutive in the frequency domain (e.g., VRB bundle 310-$g$ may not be consecutive to VRB bundle 310-$h$).

An example irregular interleaving matrix 305 when the number of rows is defined as four and the quantity of VRB bundles 310 is 10 is illustrated below by Table 12. Table 12 may further include each indices of the VRB bundles 310 written to entries within the irregular interleaving matrix 305.

TABLE 12

Example Irregular Interleaving Matrix

| | Column 1 | Column 2 | Column 3 |
|---|---|---|---|
| Row 1 | 0 | 1 | 2 |
| Row 2 | 3 | 4 | 5 |
| Row 3 | 6 | 7 | |
| Row 4 | 8 | 9 | |

The transmitting device may write the indices of the VRB bundles 310 to the irregular interleaving matrix 305 according to a first order (e.g., a row-first order, a column-first order) and read the indices out (e.g., to map the VRB bundles 310 to a PRB bundle 335) according to a different order. In the example of Table 12, the transmitting device may write the indices of the VRB bundles 310 to the irregular interleaving matrix 305 according to a row-first order. That is, the VRB bundle indices are written to consecutive entries within the first row of the irregular interleaving matrix 305, then the second row of the irregular interleaving matrix 305. Here, the transmitting device may map the VRB bundles 310 to the PRB bundles 335 according to a column-first order. That is, each of the indices (e.g., corresponding to a VRB bundle 310) within a first column of the irregular interleaving matrix 305 are mapped to PRB bundles 335 according to an order (e.g., an ascending frequency order, a descending frequency order). Then, each of the indices within the second column of the irregular interleaving matrix 305 are mapped to the next portion of consecutive PRB bundles 335. Table 13, illustrated below, shows a mapping of the VRB bundle indices to the PRB indices in the example of the irregular interleaving matrix 305 illustrated within Table 12.

TABLE 13

Example VRB Bundle to PRB Bundle Index Mapping

| VRB Bundle Index | 0 | 1 | 2 | 3 | 4 | 5 | 6 | 7 | 8 | 9 |
|---|---|---|---|---|---|---|---|---|---|---|
| PRB Bundle Index | 0 | 3 | 6 | 8 | 1 | 4 | 7 | 9 | 2 | 5 |

In the example illustrated by Table 13, the VRB bundle 310 with an index of '0' (e.g., VRB bundle 310-$a$) may be mapped to the PRB bundle with an index of '0'. Further, the VRB bundle 310 with an index of '4' (e.g., VRB bundle 310-$e$) may be mapped to the PRB bundle with an index of '1'.

The transmitting device may then utilize a look-up table (LUT), for example the LUT illustrated below in Tables 14 and 15, to determine the mapping between the existing VRB bundles 310 and the interleaved PRB bundles 335. That is, the VRB bundle indices may correspond to existing VRB bundles 310 based on a type of resource allocation. Table 14 may illustrate a LUT utilized for Type 1 resource allocations.

TABLE 14

Example LUT for Type 1

| Type 1 VRB Bundle Index | 8 | 9 | 10 | 11 | 12 | 13 | 14 | 15 | 16 | 17 |
|---|---|---|---|---|---|---|---|---|---|---|
| PRB Bundle Index | 8 | 11 | 14 | 16 | 9 | 12 | 15 | 17 | 10 | 13 |

Table 15 may illustrate an LUT for Type 0 resource allocations.

TABLE 15

Example LUT for Type 0

| Type 0 VRB Bundle Index | 2 | 3 | 6 | 7 | 16 | 17 | 18 | 19 | 20 | 21 |
|---|---|---|---|---|---|---|---|---|---|---|
| PRB Bundle Index | 2 | 7 | 18 | 20 | 3 | 16 | 19 | 21 | 6 | 17 |

The transmitting device may implement the irregular interleaving matrix 305 by running an interleaving script at the transmitting device (e.g., by a processor at the transmitting device). That is, the transmitting device may identify the set of VRB bundles 310 and run the interleaving script to determine the mapping of the VRB bundles 310 to the PRB bundles 335 according to the irregular interleaving matrix 305. In some cases, the transmitting device may identify a single VRB bundle 310 and determine a mapping to the single corresponding PRB bundle 335 based on the irregular interleaving matrix 305. For example, the transmitting device may identify VRB bundle 310-i and determine, based on the irregular interleaving matrix 305, the mapping of the VRB bundle 310-i to the PRB bundle 335-i.

An example of the interleaving script is shown below, where 'It' corresponds to a number of rows within the interleaving matrix and 'N_bundle' corresponds to a number of VRB bundles 310 to be transmitted to a receiving device.

```
C = ceil(N_bundle/R);
Rprime = N_bundle - R * (C - 1);
vRBindces = [0:N_bundle - 1]';
index = 1;
for c = 0:(C - 2)
    for r = 0:(R - 1)
        if r >= Rprime
            pRBindces(index) = r * (C - 1) + Rprime + c + 1;
            index = index + 1;
        else
            pRBindces(index) = r * C + c + 1;
            index = index + 1;
        end
    end
end
for r = 0:(Rprime - 1)
    pRBindces(index) = r * C + C;
    index = index + 1;
end
```

The transmitting device may map a VRB bundle 310 to a PRB bundle 335 on an individual basis. For example, rather than mapping a group of VRB bundles 310 to a group of PRB bundles 335, the transmitting device may map a single VRB bundle 310 (e.g., VRB bundle 310-d) to a single PRB bundle 335 (e.g., PRB bundle 335-d). An example interleaving script for mapping an individual VRB bundle 310 to a PRB bundle 335 is shown below. In the example interleaving script, 'N_bundle' may correspond to a number of VRB bundles 310 (e.g., allocated for transmissions between the transmitting and receiving device, within a bandwidth part), 'R' may correspond to a number of rows, 'C' may correspond to a number of columns, and 'j' may represent an index of a VRB bundle 310 and may range from '0' to 'N_bundle−1.' Further, 'f(j)' may correspond to an index of a PRB bundle 335.

```
Rprime = N_bundle - R * (C - 1)
c = floor(j /R)
r = j mod R
if (r < Rprime)
    f(j) = r * C + c
else
    f(j) = r * (C - 1) + c + Rprime
end
```

When the transmitting device maps a set of VRB bundles 310 to a set of PRB bundles 335, if a higher-layer parameter is enabled (e.g., if inallocation-VRB-ToPRB-interleaver is enabled), then the transmitting device may map a VRB (e.g., a VRB bundle 310) to a PRB (e.g., within a PRB bundle 335) based on whether a physical downlink shared channel (PDSCH) transmission is scheduled with downlink control information (DCI) format 1_0 with the CRC scrambled by system information-radio network temporary identifier (SI-RNTI) in Type0-physical downlink control channel (PDCCH) common search space in CORESET 0. For example, if the PDSCH transmission is not scheduled with DCI format 1_0 with the CRC scrambled by SI-RNTI in Type0-PDCCH common search space in CORESET 0, a VRB with an index j, where j is between 0 and a number of VRBs being transmitted within the PDSCH transmission (e.g., $M_{RB}^{PDSCH}-1$) is mapped to a PRB with an index f(j). Additionally or alternatively, if the PDSCH transmission is scheduled with DCI format 1_0 with the CRC scrambled by SI-RNTI in Type0-PDCCH common search space in CORESET 0, the VRB with an index j is mapped to a PRB block with an index of $l+N_{start}^{CORESET}$ where l corresponds to the index f(j)-th and $N_{start}^{CORESET}$ corresponds to a lowest-numbered PRB within the control resource set where the corresponding DCI was received.

Mapping scheme 300 may provide increased frequency diversity and remove costs (e.g., in hardware cycles) associated with dummy insertion and removal, eliminating the extra null handling.

The concatenated irregular matrix (e.g., irregular interleaving matrix 305) may have a varying number of rows depending on the column number. For example, for an arbitrarily given N_bundle, the irregular matrix may have a same number of R rows in the first (C-1) columns {0, 1, . . . C-1}, and varying rows from 1 up to Rprime in the last column depending the total number N_bundle.

Each bundle may include a bundle size L with any number less than the total number of resource blocks, either the whole bandwidth part width, or only the granted number of resource blocks. The bundle size L can be in a varying size for each bundle.

The number of rows R can be any positive number. A higher R may have high depth interleaving.

In some example, mapping scheme 300 may be backward-compatible to legacy or other prior techniques by configuring Rprime as 0, and reconstructing a regular rectangular interleaver with R by C-1.

In some examples, mapping scheme 300 may be applied to a column-row interleaver in which the number of columns is given, and the number of rows is derived with varying number of elements in the last row.

In some examples, mapping scheme 300 may be applicable to Type 1. Additionally or alternatively, mapping scheme 300 may be applicable to Type 0, for example in a frequency domain allocation. In some examples, the VRB and/or PRB block bundles may be contiguous. In other examples, the VRB and/or PRB block bundles may be dis-contiguous.

Alternatively or additionally, in some examples, the VRB indices, or PRB indices, or both, may start at a non-zero index (e.g., not necessarily starting from 0). The actual VRB, PRB, or both, index may be mapped to a lookup table with size of number of valid resource blocks.

Figure 4:
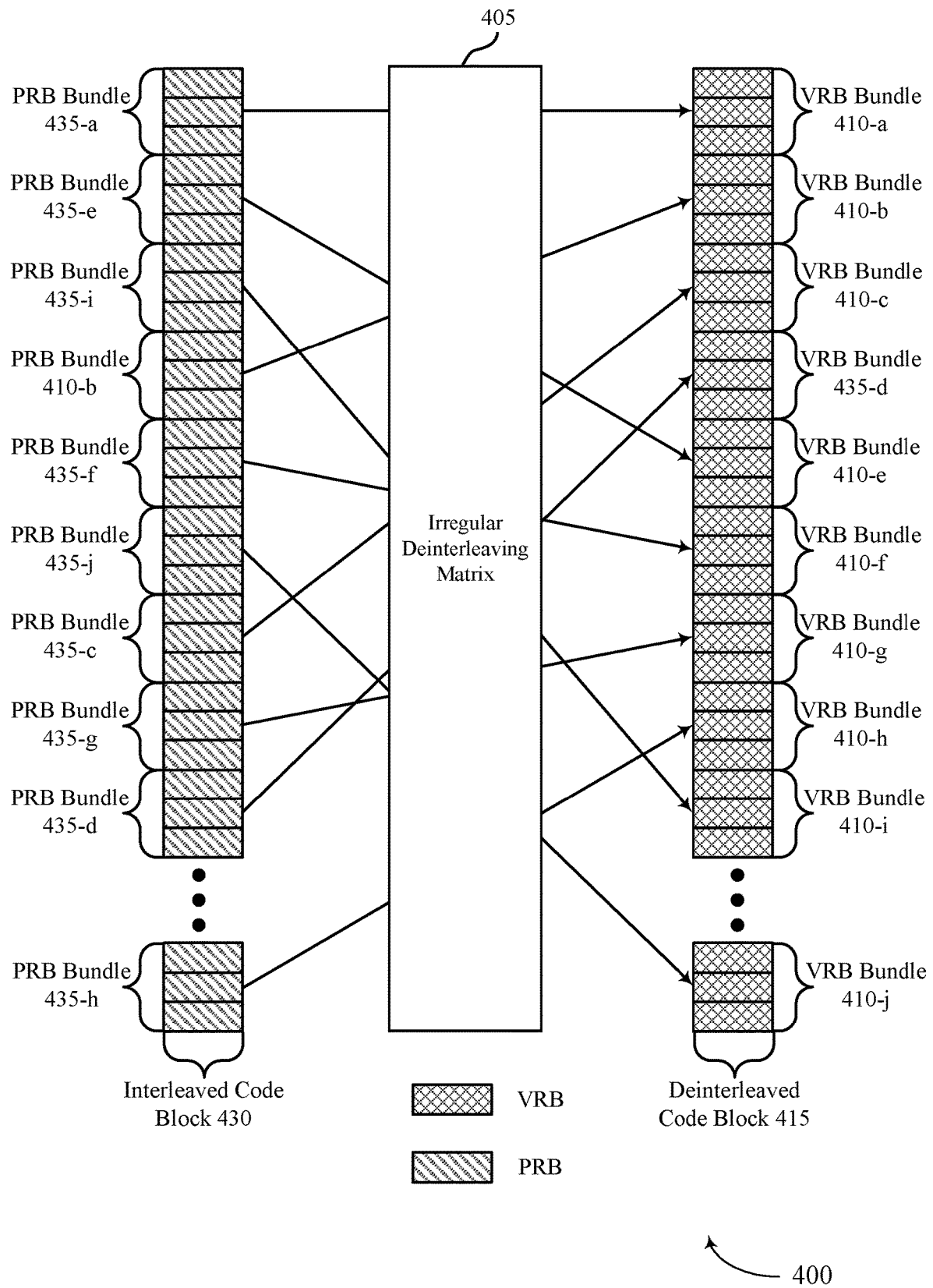

FIG. 4 illustrates an example of a mapping scheme 400 that supports methods for interleaved mapping in accordance with aspects of the present disclosure. Mapping scheme 400 may implement aspects of wireless communications system 100 and wireless communications system 200. For instance, mapping scheme 400 may include interleaved code block 430 and PRB bundles 435, which may be examples of the interleaved code block and PRB bundles, respectively, as described with reference to FIG. 2. The mapping scheme 400 may be used in conjunction with mapping scheme 300. For example, mapping scheme 300 may illustrate a mapping scheme according to an irregular interleaving matrix 305 while mapping scheme 400 may illustrate a mapping scheme 400 according to an irregular deinterleaving matrix 405. In some cases, a transmitting device may utilize mapping scheme 300 while a receiving device may utilize mapping scheme 400 for communications with the transmitting device. As described above, a receiving device (e.g., a receiving device 215) may receive the interleaved code block 430 including the PRB bundles 435. The receiving device may map the received PRB bundles 435 to VRB bundles 410 according to an irregular deinterleaving matrix 405.

The receiving device may receive an input signal from a transmitting device, the input signal including one or more interleaved code blocks 430. The receiving device may identify a set of PRBs (e.g., within the PRB bundles 435) corresponding to the one or more interleaved code blocks 430. The receiving device may determine to map each of the PRB bundles 435 to a set of VRB bundles 410 according to an irregular deinterleaving matrix 405. The receiving device may generate one or more deinterleaved code blocks 415 based on mapping the set of PRB bundles 435 to the set of VRB bundles 410. In some cases, the receiving device may receive an indication of the irregular deinterleaving matrix 405 from the transmitting from the transmitting device. The receiving device may generate the irregular deinterleaving matrix 405 to map each of the PRB bundles 435 to a VRB bundle 410. The receiving device may generate the irregular deinterleaving matrix 405 by concatenating a regular matrix (e.g., a rectangular matrix) including the defined dimension and a vector.

An example of an irregular deinterleaving matrix 405 when the number of rows is defined as four and the quantity of VRB bundles 410 and PRB bundles 435 is ten is illustrated below by Table 16. Table 16 may further include each indices of the PRB bundles 435 written to entries within the irregular deinterleaving matrix 405.

TABLE 16

Example Irregular Interleaving Matrix

|  | Column 1 | Column 2 | Column 3 |
|---|---|---|---|
| Row 1 | 0 | 4 | 8 |
| Row 2 | 1 | 5 | 9 |
| Row 3 | 2 | 6 |  |
| Row 4 | 3 | 7 |  |

Here, the receiving device may write the indices of the PRB bundles 435 to the irregular deinterleaving matrix 405 according to a column-first order. That is, the PRB bundle indices are written to consecutive entries within the first column of the irregular deinterleaving matrix 405, then the second column of the irregular deinterleaving matrix 405. The receiving device may then map the PRB bundles 435 to the VRB bundles 410 according to a row-first order. That is, each of the indices (e.g., corresponding to a PRB bundle 435) within a first row of the irregular deinterleaving matrix 405 are mapped to VRB bundles 410 according to an order (e.g., an ascending frequency order, a descending frequency order). Then, each of the indices within the second row of the irregular deinterleaving matrix 405 are mapped to the next portion of consecutive VRB bundles 410. Table 17, illustrated below, shows a mapping of the PRB bundle indices to the VRB bundle indices in the example of the irregular deinterleaving matrix 405 illustrated within Table 16.

TABLE 17

Example VRB Bundle to PRB Bundle Index Mapping

| VRB Bundle Index | 0 | 1 | 2 | 3 | 4 | 5 | 6 | 7 | 8 | 9 |
|---|---|---|---|---|---|---|---|---|---|---|
| PRB Bundle Index | 0 | 4 | 8 | 1 | 5 | 9 | 2 | 6 | 3 | 7 |

In the example illustrated by Table 17, the PRB bundle 435 with an index of '0' may be mapped to the VRB bundle 410 with an index of '0' (e.g., VRB bundle 310-$a$). Further, the PRB bundle 435 with an index of '4' may be mapped to the VRB bundle with an index of '5' (e.g., VRB bundle 410-$e$). The example illustrated by Table 17 is further illustrated by the mapping between the PRB bundles 435 and the VRB bundles 410 illustrated within FIG. 4.

The receiving device may then utilize a LUT, for example the LUT illustrated below in Tables 18 and 19, to determine the mapping between the PRB bundles 435 and the VRB bundles 410. That is, the VRB bundle indices may correspond to existing VRB bundles based on a type of resource allocation. Table 18 may illustrate a LUT utilized for Type 1 resource allocations.

TABLE 18

Example LUT for Type 1

| Type 1 VRB Bundle Index | 8 | 9 | 10 | 11 | 12 | 13 | 14 | 15 | 16 | 17 |
|---|---|---|---|---|---|---|---|---|---|---|
| PRB Bundle Index | 8 | 12 | 16 | 9 | 13 | 17 | 10 | 14 | 11 | 15 |

Table 19 may illustrate an LUT for Type 0 resource allocations.

TABLE 19

Example LUT for Type 0

| Type 0 VRB Bundle Index | 2 | 3 | 6 | 7 | 16 | 17 | 18 | 19 | 20 | 21 |
|---|---|---|---|---|---|---|---|---|---|---|
| PRB Bundle Index | 2 | 16 | 20 | 3 | 17 | 21 | 6 | 18 | 7 | 19 |

The receiving device may implement the irregular deinterleaving matrix 405 matrix by running a deinterleaving script at the receiving device (e.g., by a processor at the receiving device). That is, the receiving device may receive the set of PRB bundles 435 and run the deinterleaving script to determine the mapping of the PRB bundles 435 to the VRB bundles 410 according to the irregular deinterleaving matrix 405. In some cases, the receiving device may receive a single PRB bundle 435 and determine a mapping to the single corresponding VRB bundle 410 based on the irregular deinterleaving matrix 405. For example, the receiving device may receive PRB bundle 435-*i* and determine, based on the irregular deinterleaving matrix 405, the mapping of the PRB bundle 435-*i* to the VRB bundle 410-*i*.

An example of the deinterleaving script is shown below, where 'It' corresponds to a number of rows within the interleaving matrix and 'N_bundle' corresponds to a number of VRB bundles 310 to be transmitted to a receiving device.

```
pRBindces = [0:N_bundle - 1]';
index = 1;
for r = 0:(Rprime - 1)
    for c = 0:(C - 1)
        vRBindces(index) = c * R + r + 1;
        index = index + 1;
    end
end
for r = Rprime:(R - 1)
    for c = 0:(C - 2)
        vRBindces(index) = c * R + r + 1;
        index = index + 1;
    end
end
```

The receiving device may map a PRB bundle 435 to a VRB bundle 410 on an individual basis. For example, rather than mapping a group of PRB bundles 435 to a group of VRB bundles 410, the receiving device may map a single PRB bundle 435 (e.g., PRB bundle 435-*j*) to a single VRB bundle 410 (e.g., VRB bundle 410-*j*). An example deinterleaving script for mapping an individual PRB bundle 435 to a VRB bundle 410 is shown below. In the example deinterleaving script, 'N_bundle' may correspond to a number of PRB bundles (e.g., allocated for transmissions between the transmitting and receiving device, within a bandwidth part), 'R' may correspond to a number of rows, 'C' may correspond to a number of columns, and 'j' may represent an index of a VRB bundle 310 and may range from '0' to 'N_bundle−1.' Further, 'f_j' may correspond to an index of a PRB bundle 335.

```
Rprime = N_bundle - R * (C - 1)
r1 = floor(f_j / C)
c1 = f_j mod C
r2 = floor((f_j - Rprime * C)/(C - 1)) + Rprime
c2 = f_j - Rprime * C mod (C - 1)
if (f_j < Rprime * C)
    j = c1 * R + r1
else
    j = c2 * R + r2
end
```

Figure 5:
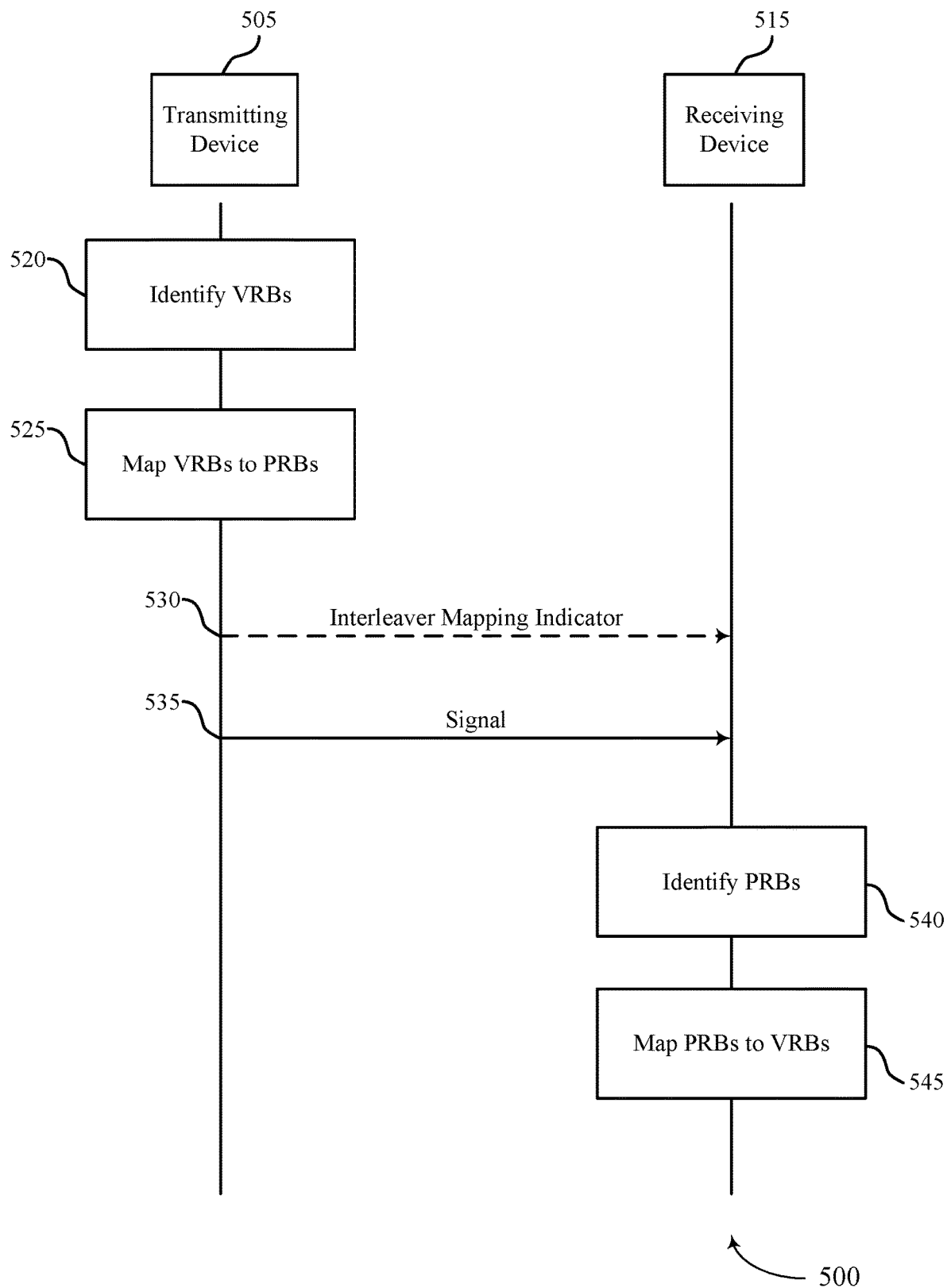
FIG. 5 illustrates an example of a process flow that supports methods for interleaved mapping in accordance with aspects of the present disclosure.

FIG. 5 illustrates an example of a process flow 500 that supports methods for interleaved mapping in accordance with aspects of the present disclosure. The process flow 500 may support aspects of the wireless communications system 100 and 200, as described with reference to FIGS. 1 and 2. For example, the process flow 500 may include communications between a transmitting device 505 or a receiving device 515. The transmitting device 505 may include aspects of a base station or a transmitting device as described with reference to FIGS. 1 and 2, respectively. The receiving device 515 may include aspects of a UE or a receiving device as described with reference to FIGS. 1 and 2 respectively. In the following description of the process flow 500, the operations performed by the transmitting device 505 and the receiving device 515 may be performed in different orders or at different times. Some operations may also be omitted from the process flow 500, and other operations may be added to the process flow 500.

At 520, the transmitting device 505 may identify a set of VRBs. In some cases, the transmitting device 505 may further determine a quantity of VRBs within the set of VRBs and generate an irregular interleaving matrix based on the quantity of VRBs. The transmitting device 505 may generate the irregular interleaving matrix by concatenating a regular matrix and a vector.

At 525, the transmitting device 505 may map, for each VRB of the set of VRBs, the VRB to one of a set of PRBs according to an irregular interleaving matrix. In some cases, the transmitting device 505 may identify an index corresponding to an entry of the irregular interleaving matrix and map the VRB to a PRB according to the index. Here, the transmitting device 505 may map only a single VRB to a single PRB. In some other cases, the transmitting device 505 may map the set of VRBs to the PRBs. The transmitting device 505 may generate one or more interleaved code blocks by mapping the VRBs to the PRBs.

At 530, the transmitting device 505 may optionally transmit, to the receiving device 515, an RRC parameter indicating that the transmitting device is using interleaver mapping (e.g., mapping the VRBs to PRBs according to an interleaving matrix). In some cases, the transmitting device may further indicate the irregular interleaving matrix to the receiving device 515. In other examples, the RRC parameter may be transmitted from transmitting device 505 to receiving device 515 prior to process flow 500, or as a first step in process flow 500.

At 535, the transmitting device 505 may transmit a signal based on the interleaved code block. That is, the signal may include one or more interleaved code blocks generated by the transmitting device. In some cases, the set of PRBs within the interleaved code blocks may span a bandwidth part. In some other cases, the set of PRBs within the interleaved code blocks may correspond to resources allocated to the receiving device 515 (e.g., for communications with the transmitting device 505).

At 540, the receiving device 515 may identify, from the signal, the set of PRBs corresponding to the one or more interleaved code blocks.

At 545, the receiving device may map, for each PRB of the set of PRBs, the PRB to one of a set of VRBs according to an irregular deinterleaving matrix to generate deinterleaved code blocks. In some cases, the receiving device 515 may generate the irregular deinterleaving matrix according to the indications received from the transmitting device 505 (e.g., at 530). Additionally or alternatively, the receiving device 515 may determine a quantity of the PRBs within the signal and generate the irregular deinterleaving matrix based on the quantity of PRBs.

Figure 6:
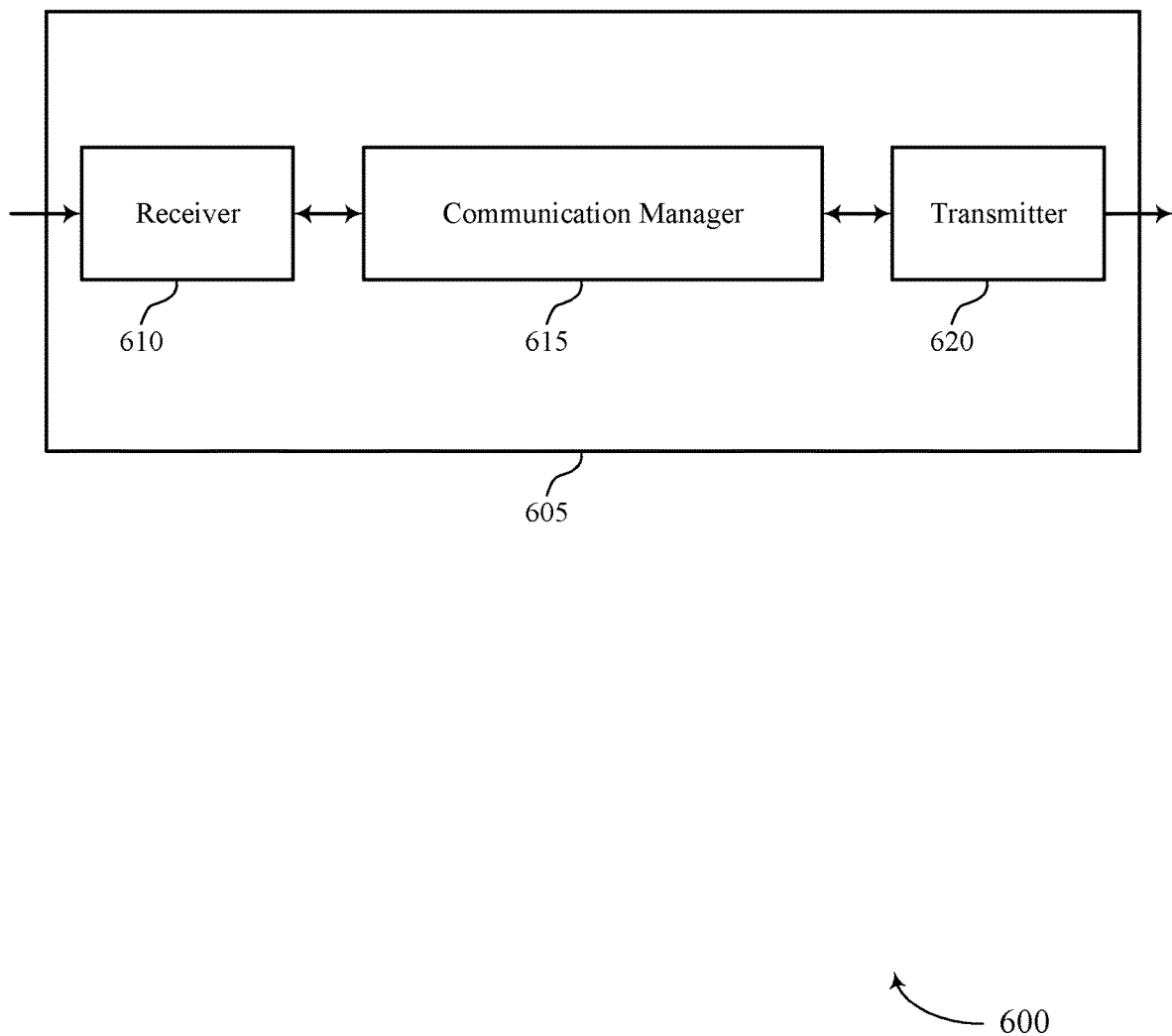
FIGS. 6 and 7 show block diagrams of devices that support methods for interleaved mapping in accordance with aspects of the present disclosure.

FIG. 6 shows a block diagram 600 of a device 605 that supports methods for interleaved mapping in accordance with aspects of the present disclosure. The device 605 may be an example of aspects of a receiving device as described herein. The device 605 may include a receiver 610, a communications manager 615, and a transmitter 620. The device 605 may also include a processor. Each of these components may be in communication with one another (e.g., via one or more buses).

The receiver 610 may receive information such as packets, user data, or control information associated with various information channels (e.g., control channels, data channels, and information related to methods for interleaved mapping, etc.). Information may be passed on to other components of the device 605. The receiver 610 may be an example of aspects of the transceiver 920 described with reference to FIG. 9. The receiver 610 may utilize a single antenna or a set of antennas.

The communications manager 615 may receive an input signal from a transmitting device, identify, from the received input signal, a set of PRBs corresponding to one or more code blocks, and map, for each PRB of the set of PRBs, the PRB to one of a set of VRBs according to an irregular deinterleaving matrix to generate deinterleaved code blocks. The communications manager 615 may be an example of aspects of the communications manager 910 described herein.

The communications manager 615, or its sub-components, may be implemented in hardware, code (e.g., software or firmware) executed by a processor, or any combination thereof. If implemented in code executed by a processor, the functions of the communications manager 615, or its sub-components may be executed by a general-purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described in the present disclosure.

The communications manager 615, or its sub-components, may be physically located at various positions, including being distributed such that portions of functions are implemented at different physical locations by one or more physical components. In some examples, the communications manager 615, or its sub-components, may be a separate and distinct component in accordance with various aspects of the present disclosure. In some examples, the communications manager 615, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 620 may transmit signals generated by other components of the device 605. In some examples, the transmitter 620 may be collocated with a receiver 610 in a transceiver module. For example, the transmitter 620 may be an example of aspects of the transceiver 920 described with reference to FIG. 9. The transmitter 620 may utilize a single antenna or a set of antennas.

Figure 7:
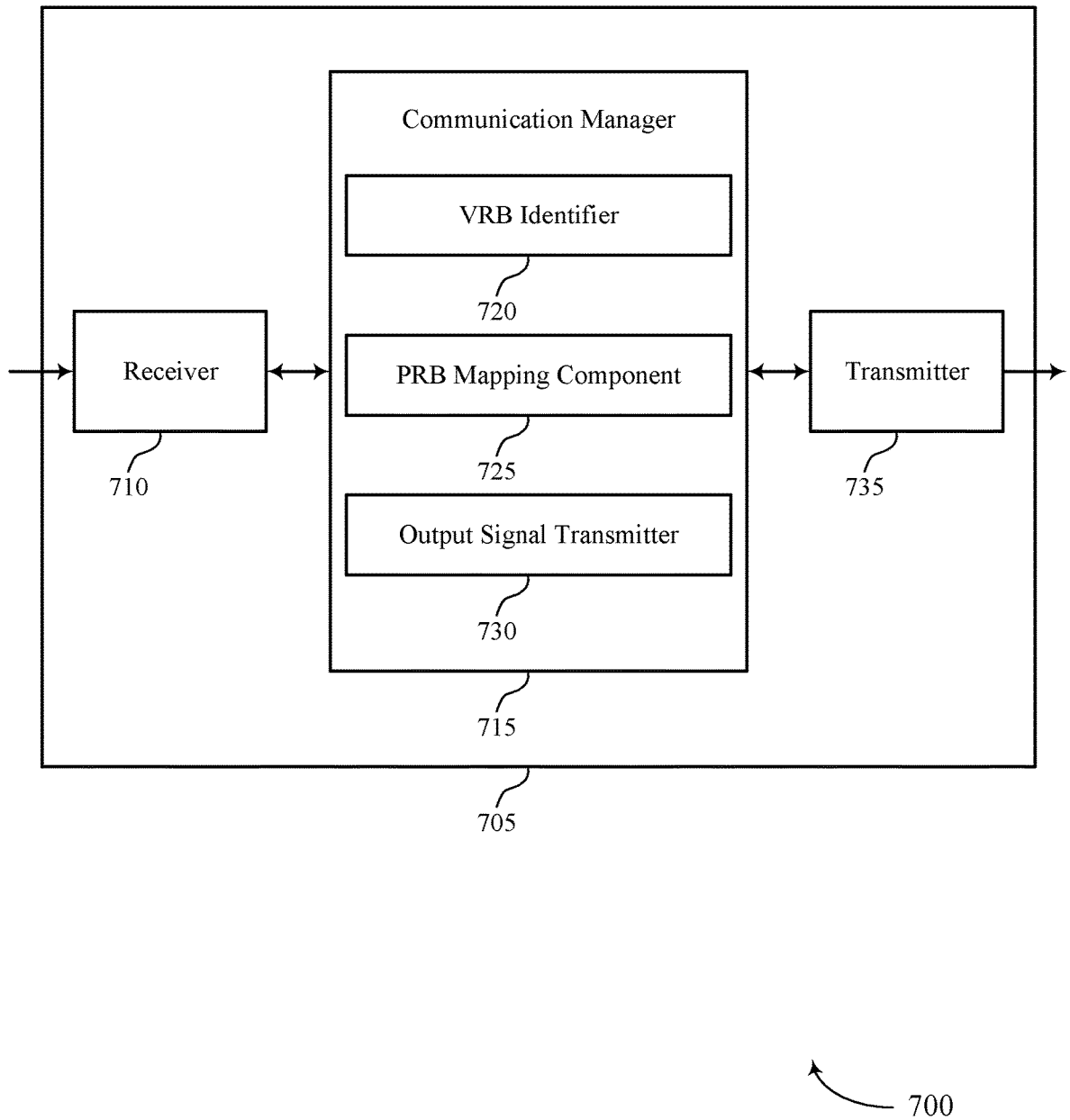

FIG. 7 shows a block diagram 700 of a device 705 that supports methods for interleaved mapping in accordance with aspects of the present disclosure. The device 705 may be an example of aspects of a device 605, or a UE 115 as described herein. The device 705 may include a receiver 710, a communications manager 715, and a transmitter 735. The device 705 may also include a processor. Each of these components may be in communication with one another (e.g., via one or more buses).

The receiver 710 may receive information such as packets, user data, or control information associated with various information channels (e.g., control channels, data channels, and information related to methods for interleaved mapping, etc.). Information may be passed on to other components of the device 705. The receiver 710 may be an example of aspects of the transceiver 920 described with reference to FIG. 9. The receiver 710 may utilize a single antenna or a set of antennas.

The communications manager 715 may be an example of aspects of the communications manager 615 as described herein. The communications manager 715 may include an input signal receiver 720, a PRB identifier 725, and a VRB mapping component 730. The communications manager 715 may be an example of aspects of the communications manager 910 described herein.

The input signal receiver 720 may receive an input signal from a transmitting device.

The PRB identifier 725 may identify, from the received input signal, a set of PRBs corresponding to one or more code blocks.

The VRB mapping component 730 may map, for each PRB of the set of PRBs, the PRB to one of a set of VRBs according to an irregular deinterleaving matrix to generate deinterleaved code blocks.

The transmitter 735 may transmit signals generated by other components of the device 705. In some examples, the transmitter 735 may be collocated with a receiver 710 in a transceiver module. For example, the transmitter 735 may be an example of aspects of the transceiver 920 described with reference to FIG. 9. The transmitter 735 may utilize a single antenna or a set of antennas.

Figure 8:
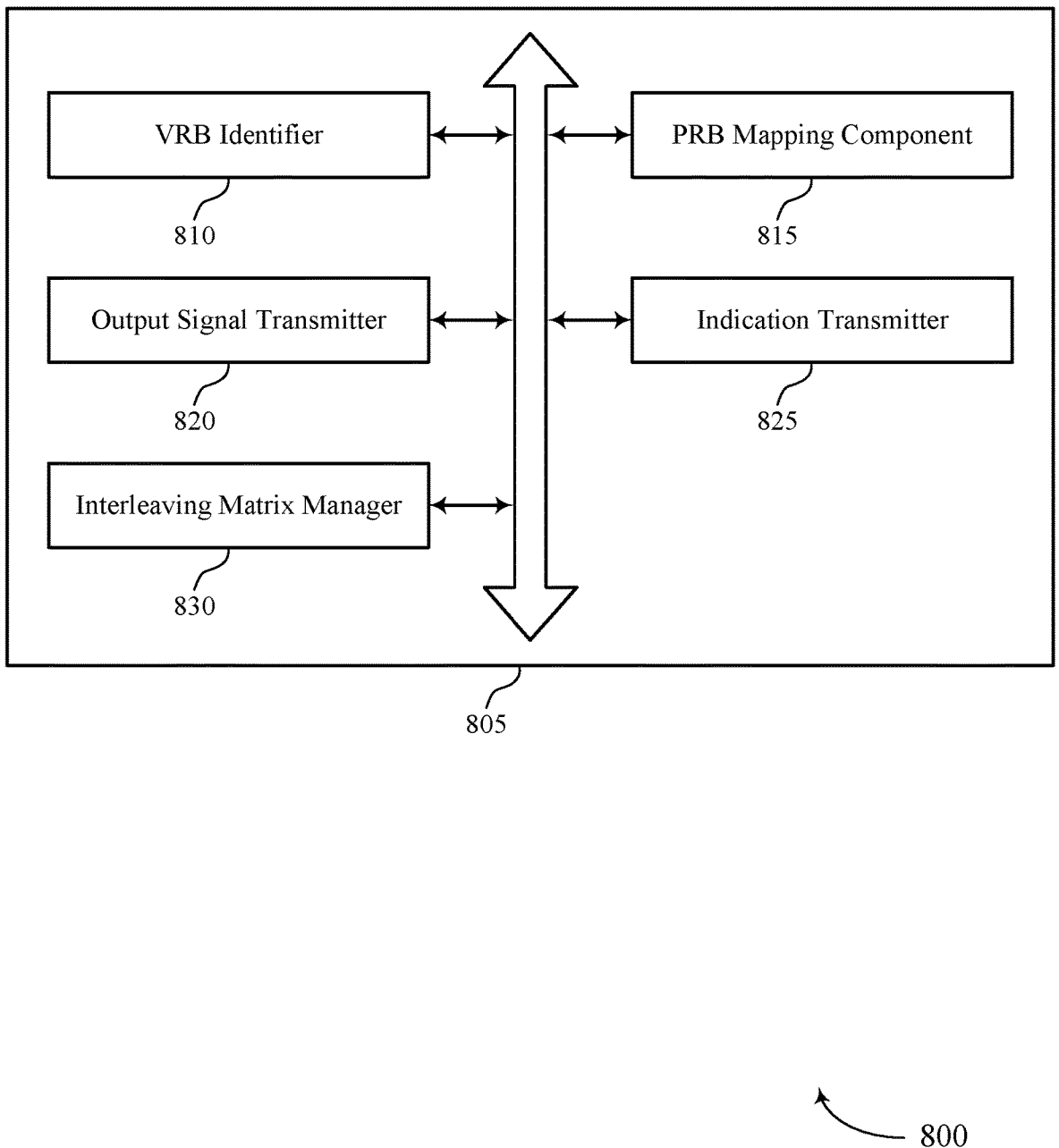
FIG. 8 shows a block diagram of a transmitting device that supports methods for interleaved mapping in accordance with aspects of the present disclosure.

FIG. 8 shows a block diagram 800 of a communications manager 805 that supports methods for interleaved mapping in accordance with aspects of the present disclosure. The communications manager 805 may be an example of aspects of a communications manager 615, a communications manager 715, or a communications manager 910 described herein. The communications manager 805 may include an input signal receiver 810, a PRB identifier 815, a VRB mapping component 820, an indication receiver 825, and a deinterleaving matrix manager 830. Each of these modules may communicate, directly or indirectly, with one another (e.g., via one or more buses).

The input signal receiver 810 may receive an input signal from a transmitting device.

The PRB identifier 815 may identify, from the received input signal, a set of PRBs corresponding to one or more code blocks. In some cases, the set of PRBs spans a bandwidth part. In some other cases, the set of PRBs corresponds to resources allocated to the receiving device.

The VRB mapping component 820 may map, for each PRB of the set of PRBs, the PRB to one of a set of VRBs according to an irregular deinterleaving matrix to generate deinterleaved code blocks. In some cases, the set of VRBs includes one or more resource block bundles, each resource block bundle including a set of VRBs of the set of VRBs. The quantity of resource block bundles of the set of VRBs and a quantity of entries in the irregular deinterleaving matrix may be a same quantity.

In some examples, the VRB mapping component 820 may identify an index corresponding to an entry of the irregular deinterleaving matrix associated with the PRB, where mapping the PRB to one of the set of VRBs is based on the identified index. In some cases, the VRB mapping component 820 may map the PRB to one of the set of VRBs according to the identified index. In some instances, the VRB mapping component 820 may identify an index corresponding to an entry of the irregular deinterleaving matrix based on a column-first order. In some examples, the VRB mapping component 820 may identify an index corresponding to an entry of the irregular deinterleaving matrix based on a row-first order.

The indication receiver 825 may receive, from the transmitting device, an indication of the irregular deinterleaving matrix. In some examples, the indication receiver 825 may receive, from the transmitting device, an RRC parameter indicating that the transmitting device uses interleaver mapping.

The deinterleaving matrix manager 830 may determine a quantity of PRBs of the set of PRBs. In some examples, the deinterleaving matrix manager 830 may generate the irregular deinterleaving matrix based on the determined quantity of PRBs. In some examples, the deinterleaving matrix manager 830 may concatenate a regular matrix and a vector to generate the irregular deinterleaving matrix, where the regular matrix corresponds to a first number of PRBs of the set of PRBs, and the vector corresponds to a remaining portion of PRBs of the set of PRBs. The regular matrix may include a first number of rows and a first number of columns and the vector may include a single column and a second number of rows. The second number of rows may be less than the first number of rows or equal to the first number of rows.

Figure 9:
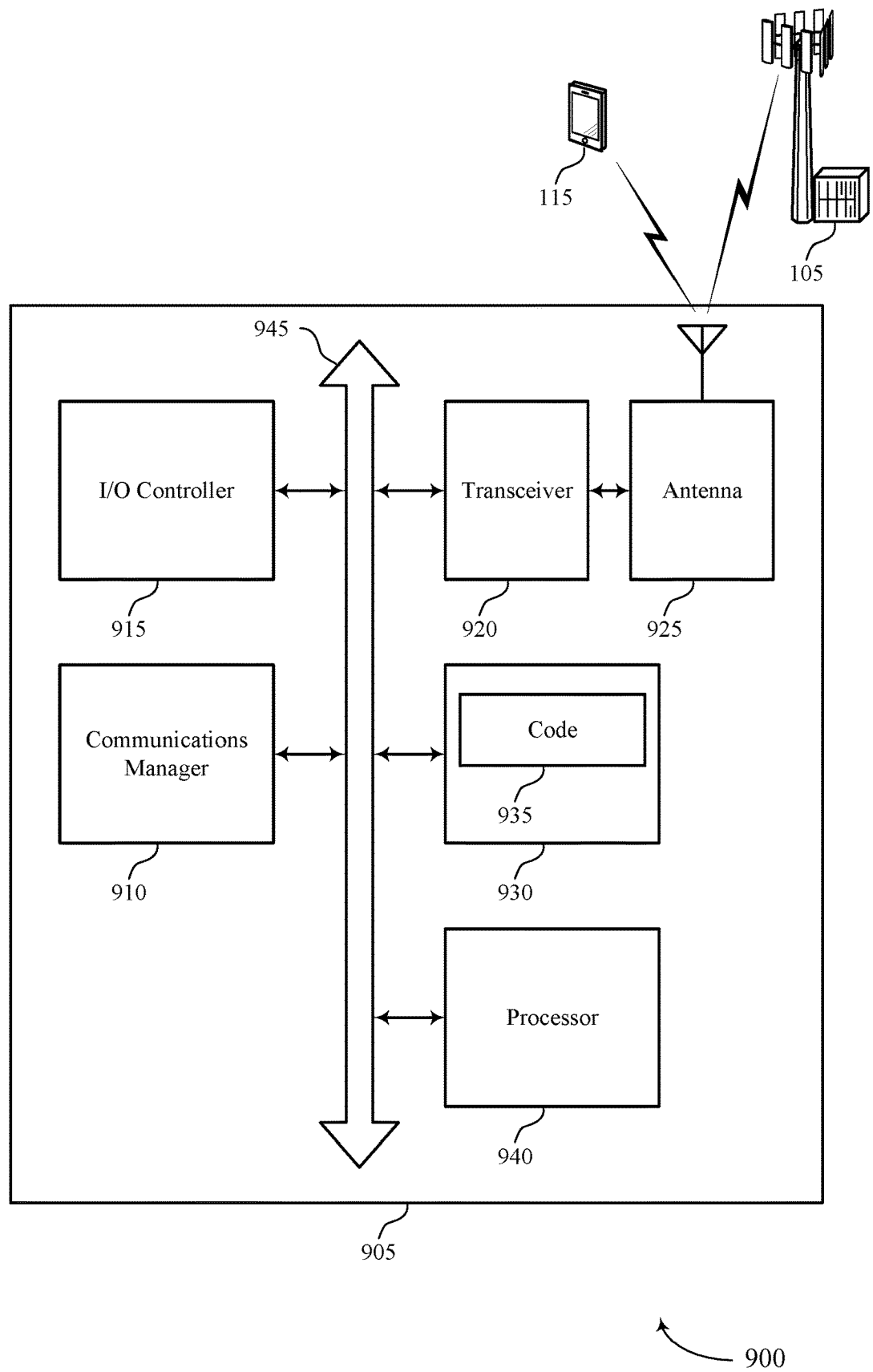
FIG. 9 shows a diagram of a system including a device that supports methods for interleaved mapping in accordance with aspects of the present disclosure.

FIG. 9 shows a diagram of a system 900 including a device 905 that supports methods for interleaved mapping in accordance with aspects of the present disclosure. The device 905 may be an example of or include the components of device 605, device 705, a UE 115, or a receiving device as described herein. The device 905 may include components for bi-directional voice and data communications including components for transmitting and receiving communications, including a communications manager 910, an I/O controller 915, a transceiver 920, an antenna 925, memory 930, and a processor 940. These components may be in electronic communication via one or more buses (e.g., bus 945).

The communications manager 910 may receive an input signal from a transmitting device, identify, from the received input signal, a set of PRBs corresponding to one or more code blocks, and map, for each PRB of the set of PRBs, the PRB to one of a set of VRBs according to an irregular deinterleaving matrix to generate deinterleaved code blocks.

The I/O controller 915 may manage input and output signals for the device 905. The I/O controller 915 may also manage peripherals not integrated into the device 905. In some cases, the I/O controller 915 may represent a physical connection or port to an external peripheral. In some cases, the I/O controller 915 may utilize an operating system such as iOS®, ANDROID®, MS-DOS®, MS-WINDOWS®, OS/2®, UNIX®, LINUX®, or another known operating system. In other cases, the I/O controller 915 may represent or interact with a modem, a keyboard, a mouse, a touchscreen, or a similar device. In some cases, the I/O controller 915 may be implemented as part of a processor. In some cases, a user may interact with the device 905 via the I/O controller 915 or via hardware components controlled by the I/O controller 915.

The transceiver 920 may communicate bi-directionally, via one or more antennas, wired, or wireless links as described above. For example, the transceiver 920 may represent a wireless transceiver and may communicate bi-directionally with another wireless transceiver. The transceiver 920 may also include a modem to modulate the packets and provide the modulated packets to the antennas for transmission, and to demodulate packets received from the antennas.

In some cases, the wireless device may include a single antenna 925. However, in some cases the device may have more than one antenna 925, which may be capable of concurrently transmitting or receiving multiple wireless transmissions.

The memory 930 may include random-access memory (RAM) and read-only memory (ROM). The memory 930 may store computer-readable, computer-executable code 935 including instructions that, when executed, cause the processor to perform various functions described herein. In some cases, the memory 930 may contain, among other things, a basic input/output system (BIOS) which may control basic hardware or software operation such as the interaction with peripheral components or devices.

The processor 940 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 940 may be configured to operate a memory array using a memory controller. In other cases, a memory controller may be integrated into the processor 940. The processor 940 may be configured to execute computer-readable instructions stored in a memory (e.g., the memory 930) to cause the device 905 to perform various functions (e.g., functions or tasks supporting methods for interleaved mapping).

The code 935 may include instructions to implement aspects of the present disclosure, including instructions to support wireless communication. The code 935 may be stored in a non-transitory computer-readable medium such as system memory or other type of memory. In some cases, the code 935 may not be directly executable by the processor 940 but may cause a computer (e.g., when compiled and executed) to perform functions described herein.

Figure 10:
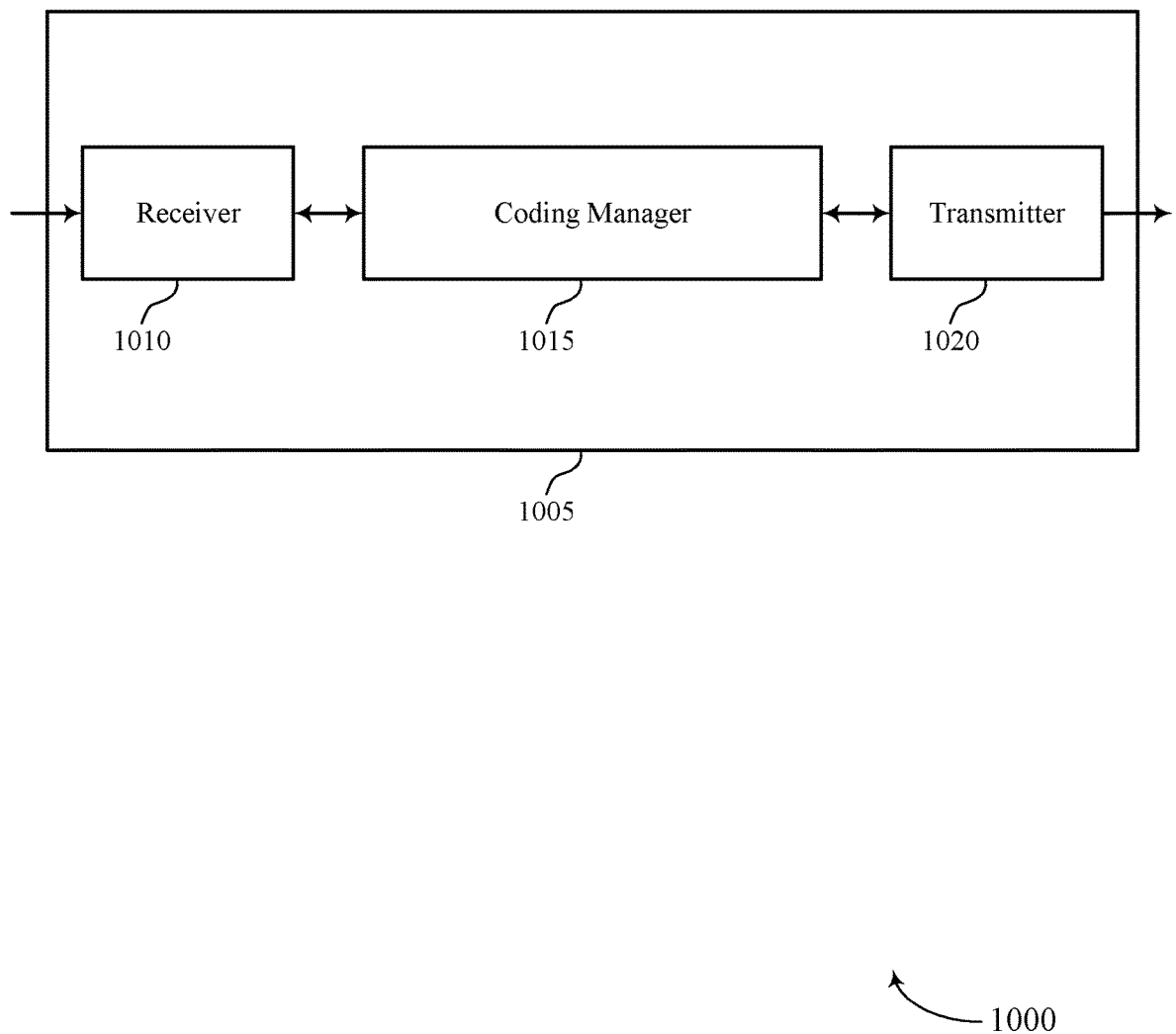
FIGS. 10 and 11 show block diagrams of devices that support methods for interleaved mapping in accordance with aspects of the present disclosure.

FIG. 10 shows a block diagram 1000 of a device 1005 that supports methods for interleaved mapping in accordance with aspects of the present disclosure. The device 1005 may be an example of aspects of a base station 105 or a transmitting device as described herein. The device 1005 may include a receiver 1010, a coding manager 1015, and a transmitter 1020. The device 1005 may also include a processor. Each of these components may be in communication with one another (e.g., via one or more buses).

The receiver 1010 may receive information such as packets, user data, or control information associated with various information channels (e.g., control channels, data channels, and information related to methods for interleaved mapping, etc.). Information may be passed on to other components of the device 1005. The receiver 1010 may be an example of aspects of the transceiver 1320 described with reference to FIG. 13. The receiver 1010 may utilize a single antenna or a set of antennas.

The coding manager 1015 may identify a set of VRBs corresponding to one or more code blocks to be transmitted to a receiving device, map, for each VRB of the set of VRBs, the VRB to one of a set of PRBs according to an irregular interleaving matrix to generate interleaved code blocks, and transmit an output signal to the receiving device based on the interleaved code block. The coding manager 1015 may be an example of aspects of the coding manager 1310 described herein.

The actions performed by the coding manager 1015 as described herein may be implemented to realize one or more potential advantages. For example, generating an irregular interleaving matrix based on a quantity of VRBs to be transmitted to a receiving device may increase the frequency diversity associated with that transmission. Specifically, rather than not interleaving a portion of the VRBs (e.g., a portion of the VRBs that may not be mapped to a regular interleaving matrix), the coding manager 1015 may generate an irregular interleaving manager that may interleave each of the VRBs to be transmitted to the receiving device. Based on generating the irregular interleaving matrix, the receiver 1010 may transmit an output signal based on the irregular interleaving matrix.

The coding manager 1015, or its sub-components, may be implemented in hardware, code (e.g., software or firmware) executed by a processor, or any combination thereof. If implemented in code executed by a processor, the functions of the Coding manager 1015, or its sub-components may be executed by a general-purpose processor, a DSP, an application-specific integrated circuit (ASIC), a FPGA or other programmable logic device, discrete gate or transistor logic, discrete hardware components, or any combination thereof designed to perform the functions described in the present disclosure.

The coding manager 1015, or its sub-components, may be physically located at various positions, including being distributed such that portions of functions are implemented at different physical locations by one or more physical components. In some examples, the coding manager 1015, or its sub-components, may be a separate and distinct component in accordance with various aspects of the present disclosure. In some examples, the coding manager 1015, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 1020 may transmit signals generated by other components of the device 1005. In some examples, the transmitter 1020 may be collocated with a receiver 1010 in a transceiver module. For example, the transmitter 1020 may be an example of aspects of the transceiver 1320 described with reference to FIG. 13. The transmitter 1020 may utilize a single antenna or a set of antennas.

Figure 11:
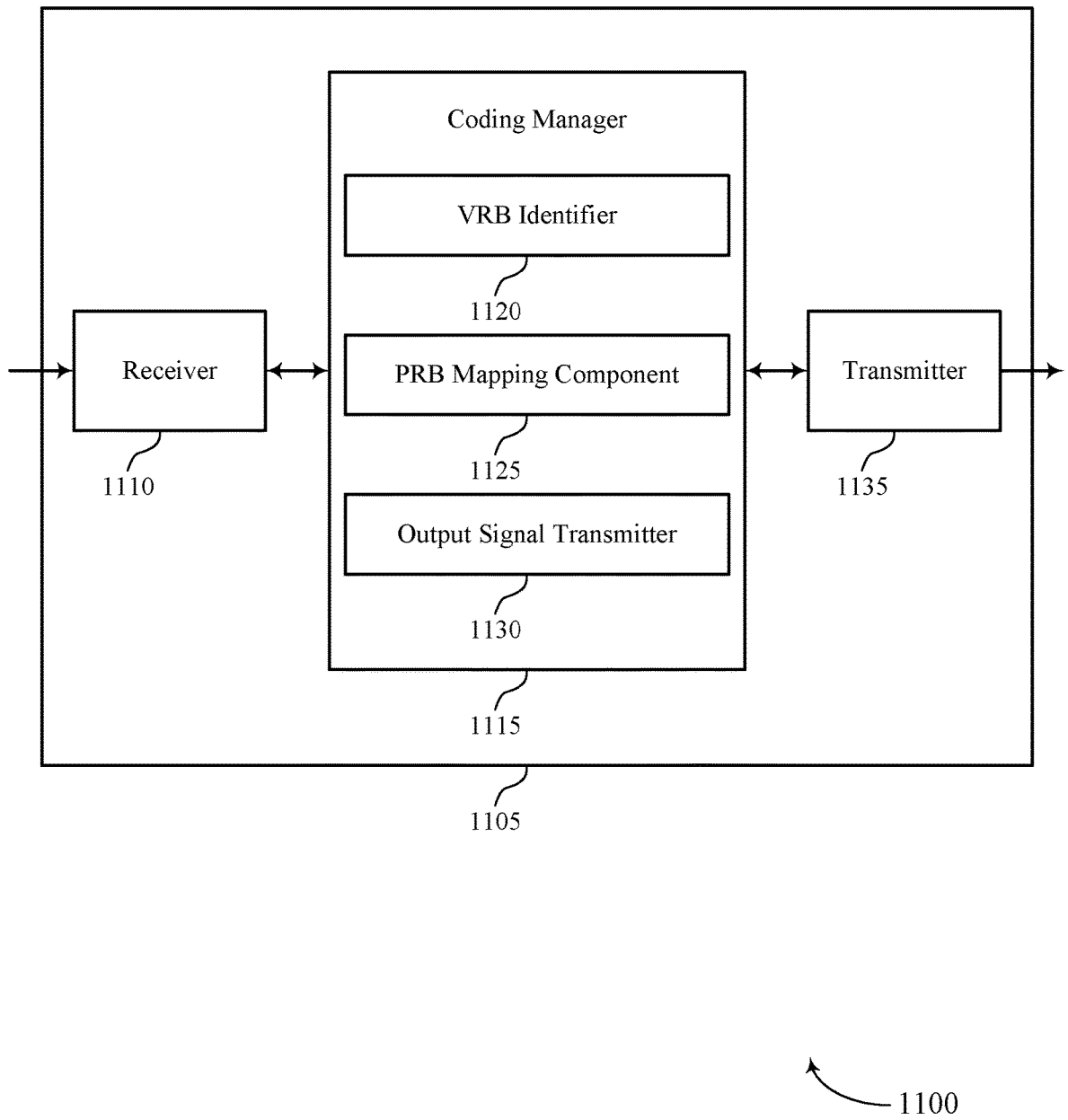

FIG. 11 shows a block diagram 1100 of a device 1105 that supports methods for interleaved mapping in accordance with aspects of the present disclosure. The device 1105 may be an example of aspects of a device 1005, or a base station 105 as described herein. The device 1105 may include a receiver 1110, a coding manager 1115, and a transmitter 1135. The device 1105 may also include a processor. Each of these components may be in communication with one another (e.g., via one or more buses).

The receiver 1110 may receive information such as packets, user data, or control information associated with various information channels (e.g., control channels, data channels, and information related to methods for interleaved mapping, etc.). Information may be passed on to other components of the device 1105. The receiver 1110 may be an example of aspects of the transceiver 1320 described with reference to FIG. 13. The receiver 1110 may utilize a single antenna or a set of antennas.

The coding manager 1115 may be an example of aspects of the Coding manager 1015 as described herein. The Coding manager 1115 may include a VRB identifier 1120, a PRB mapping component 1125, and an output signal transmitter 1130. The Coding manager 1115 may be an example of aspects of the Coding manager 1310 described herein.

The VRB identifier 1120 may identify a set of VRBs corresponding to one or more code blocks to be transmitted to a receiving device.

The PRB mapping component 1125 may map, for each VRB of the set of VRBs, the VRB to one of a set of PRBs according to an irregular interleaving matrix to generate interleaved code blocks.

The output signal transmitter 1130 may transmit an output signal to the receiving device based on the interleaved code block.

The transmitter 1135 may transmit signals generated by other components of the device 1105. In some examples, the transmitter 1135 may be collocated with a receiver 1110 in a transceiver module. For example, the transmitter 1135 may be an example of aspects of the transceiver 1320 described with reference to FIG. 13. The transmitter 1135 may utilize a single antenna or a set of antennas.

Figure 12:
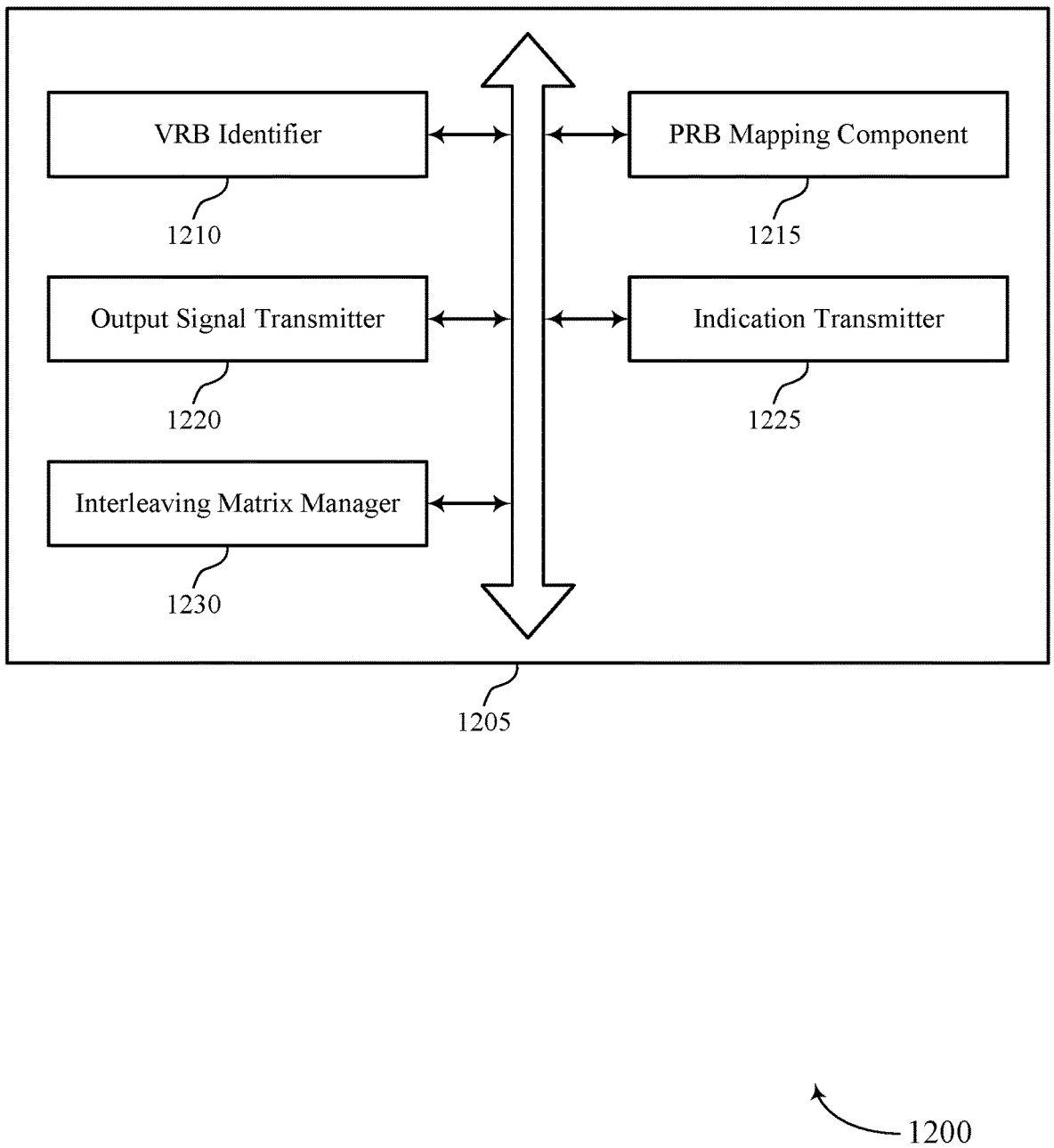
FIG. 12 shows a block diagram of a receiving device that supports methods for interleaved mapping in accordance with aspects of the present disclosure.

FIG. 12 shows a block diagram 1200 of a coding manager 1205 that supports methods for interleaved mapping in accordance with aspects of the present disclosure. The coding manager 1205 may be an example of aspects of a coding manager 1015, a coding manager 1115, or a coding manager 1310 described herein. The coding manager 1205 may include a VRB identifier 1210, a PRB mapping component 1215, an output signal transmitter 1220, an indication transmitter 1225, and an interleaving matrix manager 1230. Each of these modules may communicate, directly or indirectly, with one another (e.g., via one or more buses).

The VRB identifier 1210 may identify a set of VRBs corresponding to one or more code blocks to be transmitted to a receiving device. In some cases, the set of VRBs includes one or more resource block bundles, each resource block bundle including a set of VRBs of the set of VRBs.

The PRB mapping component 1215 may map, for each VRB of the set of VRBs, the VRB to one of a set of PRBs according to an irregular interleaving matrix to generate interleaved code blocks. In some cases, the set of PRBs spans a bandwidth part. In some cases, the set of PRBs corresponds to resources allocated to the receiving device. In some cases, a quantity of resource block bundles of the set of VRBs and a quantity of entries in the irregular interleaving matrix are a same quantity.

In some examples, the PRB mapping component 1215 may identify an index corresponding to an entry of the irregular interleaving matrix associated with the VRB, where mapping the VRB to one of the set of PRBs is based on the identified index. In some examples, the PRB mapping component 1215 may identify an index corresponding to an entry of the irregular interleaving matrix based on a column-first order. In some examples, the PRB mapping component 1215 may identify an index corresponding to an entry of the irregular interleaving matrix based on a row-first order. In some examples, the PRB mapping component 1215 may map the VRB to one of the set of PRBs according to the identified index.

The output signal transmitter 1220 may transmit an output signal to the receiving device based on the interleaved code block.

The indication transmitter 1225 may transmit, to the receiving device, an indication of the irregular interleaving matrix. In some examples, the indication transmitter 1225 may transmit, to the receiving device, an RRC parameter indicating that the transmitting device uses interleaver mapping.

The interleaving matrix manager 1230 may determine a quantity of VRBs of the set of VRBs. In some examples, the interleaving matrix manager 1230 may generate the irregular interleaving matrix based on the determined quantity. In some examples, the interleaving matrix manager 1230 may concatenate a regular matrix and a vector to generate the irregular interleaving matrix, where the regular matrix corresponds to a first portion of VRBs of the set of VRBs, and the vector corresponds to a remaining portion of VRBs of the set of VRBs. The regular matrix may include a first number of rows and a first number of columns and the vector may include a single column and a second number of rows.

The second number of rows may be less than the first number of rows or equal to the first number of rows.

Figure 13:
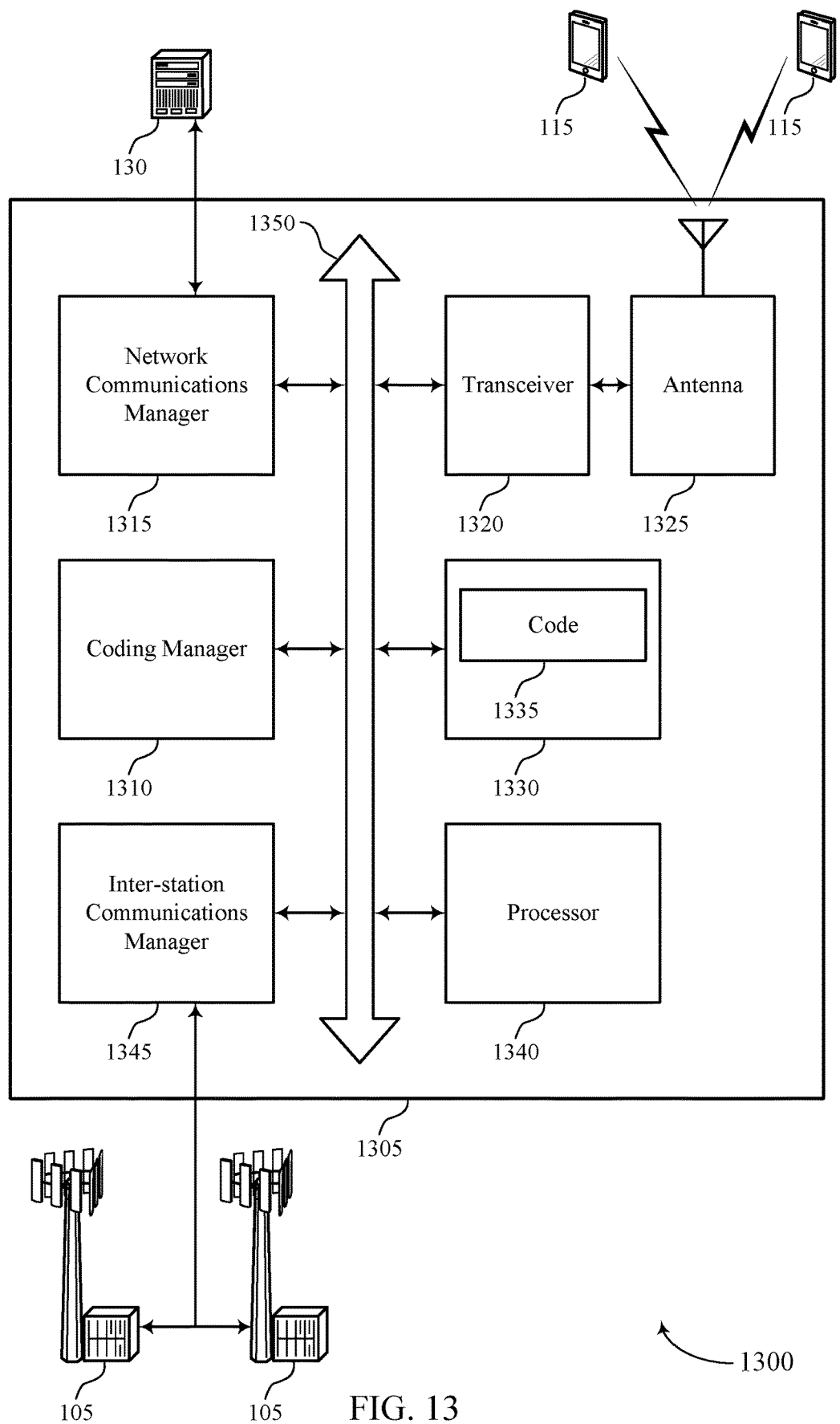
FIG. 13 shows a diagram of a system including a device that supports methods for interleaved mapping in accordance with aspects of the present disclosure.

FIG. 13 shows a diagram of a system 1300 including a device 1305 that supports methods for interleaved mapping in accordance with aspects of the present disclosure. The device 1305 may be an example of or include the components of device 1005, device 1105, or a base station 105 as described herein. The device 1305 may include components for bi-directional voice and data communications including components for transmitting and receiving communications, including a coding manager 1310, a network communications manager 1315, a transceiver 1320, an antenna 1325, memory 1330, a processor 1340, and an inter-station communications manager 1345. These components may be in electronic communication via one or more buses (e.g., bus 1350).

The coding manager 1310 may identify a set of VRBs corresponding to one or more code blocks to be transmitted to a receiving device, map, for each VRB of the set of VRBs, the VRB to one of a set of PRBs according to an irregular interleaving matrix to generate interleaved code blocks, and transmit an output signal to the receiving device based on the interleaved code block.

The network communications manager 1315 may manage communications with the core network (e.g., via one or more wired backhaul links). For example, the network communications manager 1315 may manage the transfer of data communications for client devices, such as one or more UEs 115.

The transceiver 1320 may communicate bi-directionally, via one or more antennas, wired, or wireless links as described above. For example, the transceiver 1320 may represent a wireless transceiver and may communicate bi-directionally with another wireless transceiver. The transceiver 1320 may also include a modem to modulate the packets and provide the modulated packets to the antennas for transmission, and to demodulate packets received from the antennas.

In some cases, the wireless device may include a single antenna 1325. However, in some cases the device may have more than one antenna 1325, which may be capable of concurrently transmitting or receiving multiple wireless transmissions.

The memory 1330 may include RAM, ROM, or a combination thereof. The memory 1330 may store computer-readable code 1335 including instructions that, when executed by a processor (e.g., the processor 1340) cause the device to perform various functions described herein. In some cases, the memory 1330 may contain, among other things, a BIOS which may control basic hardware or software operation such as the interaction with peripheral components or devices.

The processor 1340 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1340 may be configured to operate a memory array using a memory controller. In some cases, a memory controller may be integrated into processor 1340. The processor 1340 may be configured to execute computer-readable instructions stored in a memory (e.g., the memory 1330) to cause the device 1305 to perform various functions (e.g., functions or tasks supporting methods for interleaved mapping).

The inter-station communications manager 1345 may manage communications with other base station 105, and may include a controller or scheduler for controlling communications with UEs 115 in cooperation with other base stations 105. For example, the inter-station communications manager 1345 may coordinate scheduling for transmissions to UEs 115 for various interference mitigation techniques such as beamforming or joint transmission. In some examples, the inter-station communications manager 1345 may provide an X2 interface within an LTE/LTE-A wireless communication network technology to provide communication between base stations 105.

The code 1335 may include instructions to implement aspects of the present disclosure, including instructions to support wireless communication. The code 1335 may be stored in a non-transitory computer-readable medium such as system memory or other type of memory. In some cases, the code 1335 may not be directly executable by the processor 1340 but may cause a computer (e.g., when compiled and executed) to perform functions described herein.

Figure 14:
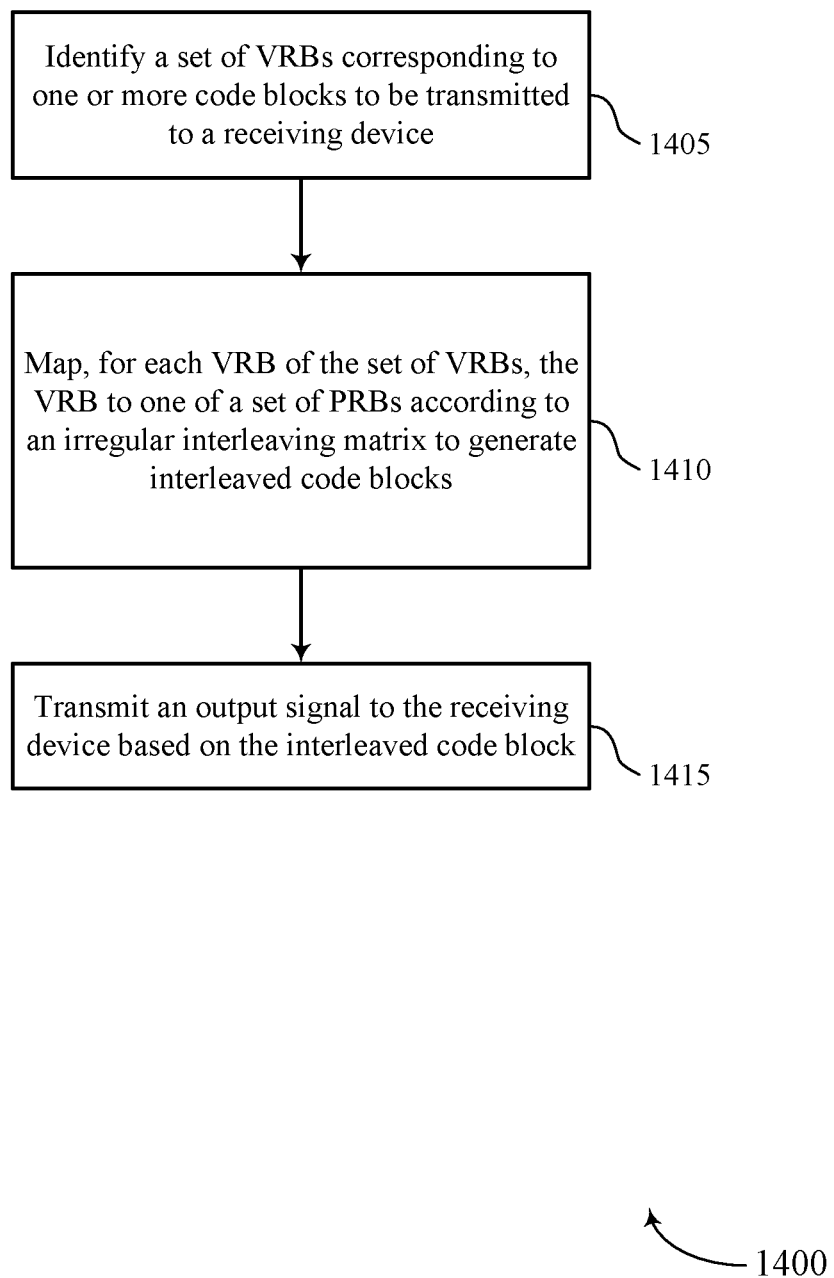
FIGS. 14 through 17 show flowcharts illustrating methods that support methods for interleaved mapping in accordance with aspects of the present disclosure.

FIG. 14 shows a flowchart illustrating a method 1400 that supports methods for interleaved mapping in accordance with aspects of the present disclosure. The operations of method 1400 may be implemented by a base station 105 or its components as described herein. For example, the operations of method 1400 may be performed by a Coding manager as described with reference to FIGS. 10 through 13. In some examples, a base station may execute a set of instructions to control the functional elements of the base station to perform the functions described below. Additionally or alternatively, a base station may perform aspects of the functions described below using special-purpose hardware.

At 1405, the base station may identify a set of VRBs corresponding to one or more code blocks to be transmitted to a receiving device. The operations of 1405 may be performed according to the methods described herein. In some examples, aspects of the operations of 1405 may be performed by a VRB identifier as described with reference to FIGS. 10 through 13.

At 1410, the base station may map, for each VRB of the set of VRBs, the VRB to one of a set of PRBs according to an irregular interleaving matrix to generate interleaved code blocks. The operations of 1410 may be performed according to the methods described herein. In some examples, aspects of the operations of 1410 may be performed by a PRB mapping component as described with reference to FIGS. 10 through 13.

At 1415, the base station may transmit an output signal to the receiving device based on the interleaved code block. The operations of 1415 may be performed according to the methods described herein. In some examples, aspects of the operations of 1415 may be performed by an output signal transmitter as described with reference to FIGS. 10 through 13.

Figure 15:
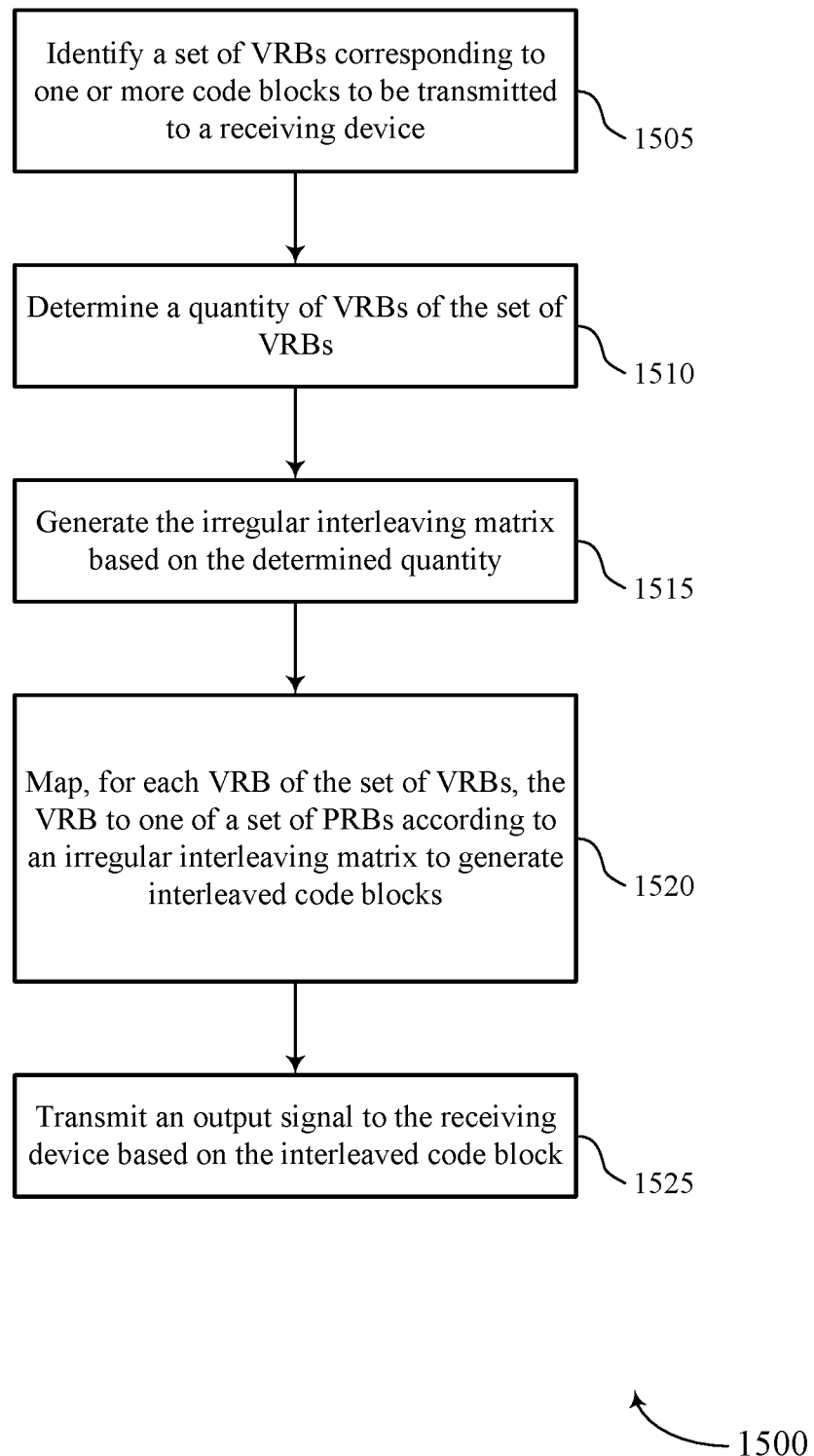

FIG. 15 shows a flowchart illustrating a method 1500 that supports methods for interleaved mapping in accordance with aspects of the present disclosure. The operations of method 1500 may be implemented by a base station 105 or its components as described herein. For example, the operations of method 1500 may be performed by a Coding manager as described with reference to FIGS. 10 through 13. In some examples, a base station may execute a set of instructions to control the functional elements of the base station to perform the functions described below. Additionally or alternatively, a base station may perform aspects of the functions described below using special-purpose hardware.

At 1505, the base station may identify a set of VRBs corresponding to one or more code blocks to be transmitted to a receiving device. The operations of 1505 may be performed according to the methods described herein. In some examples, aspects of the operations of 1505 may be performed by a VRB identifier as described with reference to FIGS. 10 through 13.

At 1510, the base station may determine a quantity of VRBs of the set of VRBs. The operations of 1510 may be performed according to the methods described herein. In some examples, aspects of the operations of 1510 may be performed by an interleaving matrix manager as described with reference to FIGS. 10 through 13.

At 1515, the base station may generate the irregular interleaving matrix based on the determined quantity. The operations of 1515 may be performed according to the methods described herein. In some examples, aspects of the operations of 1515 may be performed by an interleaving matrix manager as described with reference to FIGS. 10 through 13.

At 1520, the base station may map, for each VRB of the set of VRBs, the VRB to one of a set of PRBs according to an irregular interleaving matrix to generate interleaved code blocks. The operations of 1520 may be performed according to the methods described herein. In some examples, aspects of the operations of 1520 may be performed by a PRB mapping component as described with reference to FIGS. 10 through 13.

At 1525, the base station may transmit an output signal to the receiving device based on the interleaved code block. The operations of 1525 may be performed according to the methods described herein. In some examples, aspects of the operations of 1525 may be performed by an output signal transmitter as described with reference to FIGS. 10 through 13.

Figure 16:
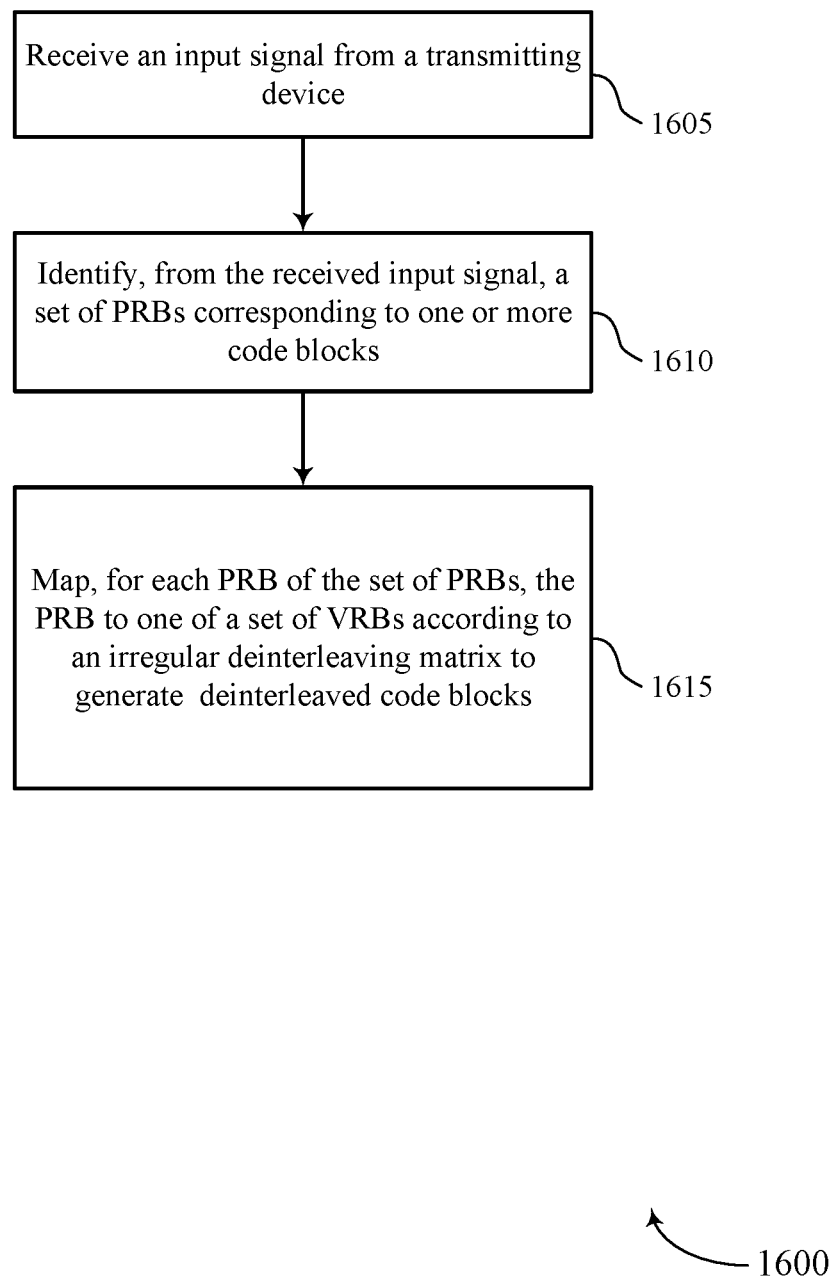

FIG. 16 shows a flowchart illustrating a method 1600 that supports methods for interleaved mapping in accordance with aspects of the present disclosure. The operations of method 1600 may be implemented by a UE 115 or its components as described herein. For example, the operations of method 1600 may be performed by a communications manager as described with reference to FIGS. 6 through 9. In some examples, a UE may execute a set of instructions to control the functional elements of the UE to perform the functions described below. Additionally or alternatively, a UE may perform aspects of the functions described below using special-purpose hardware.

At 1605, the UE may receive an input signal from a transmitting device. The operations of 1605 may be performed according to the methods described herein. In some examples, aspects of the operations of 1605 may be performed by an input signal receiver as described with reference to FIGS. 6 through 9.

At 1610, the UE may identify, from the received input signal, a set of PRBs corresponding to one or more code blocks. The operations of 1610 may be performed according to the methods described herein. In some examples, aspects of the operations of 1610 may be performed by a PRB identifier as described with reference to FIGS. 6 through 9.

At 1615, the UE may map, for each PRB of the set of PRBs, the PRB to one of a set of VRBs according to an irregular deinterleaving matrix to generate deinterleaved code blocks. The operations of 1615 may be performed according to the methods described herein. In some examples, aspects of the operations of 1615 may be performed by a VRB mapping component as described with reference to FIGS. 6 through 9.

Figure 17:
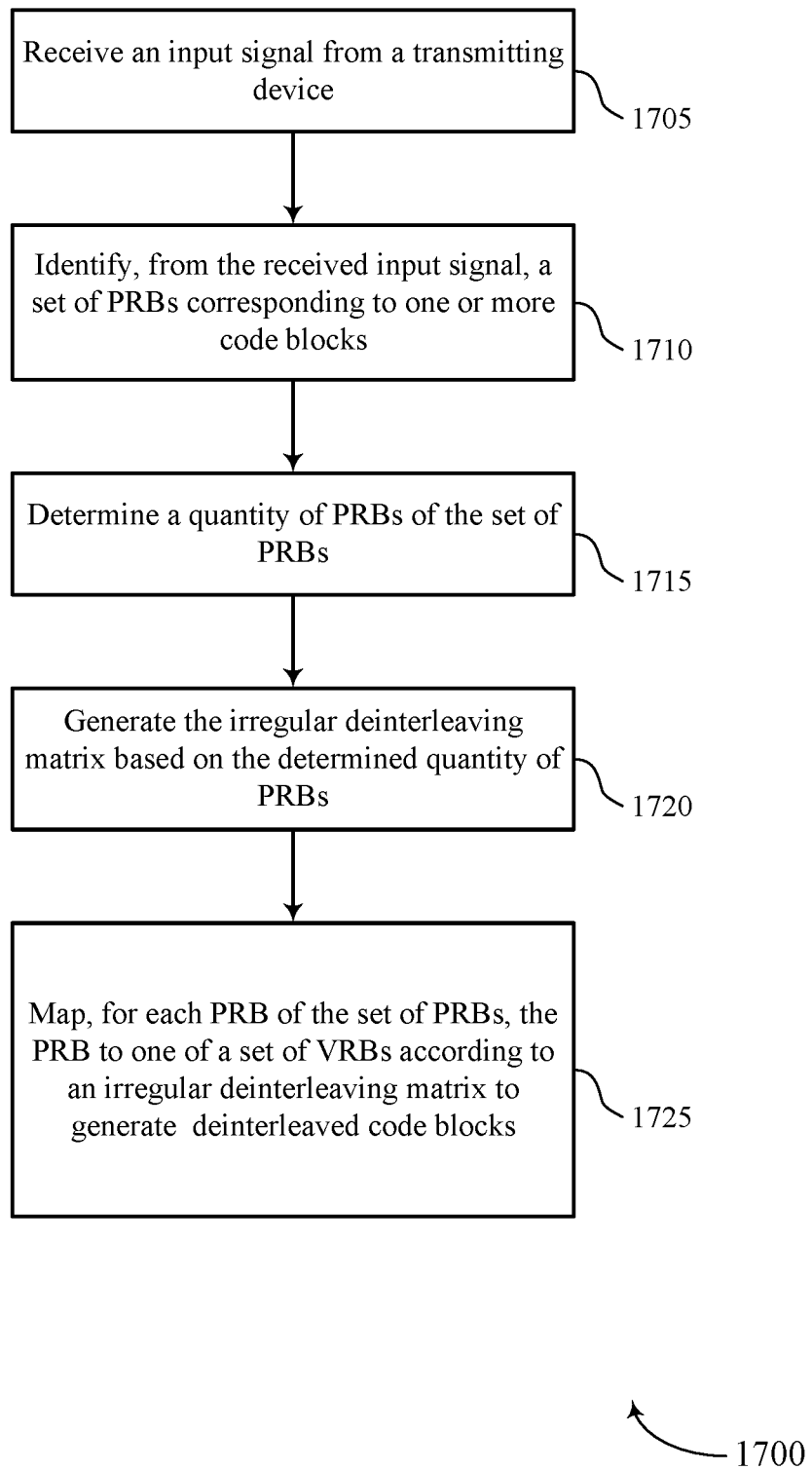

FIG. 17 shows a flowchart illustrating a method 1700 that supports methods for interleaved mapping in accordance with aspects of the present disclosure. The operations of method 1700 may be implemented by a UE 115 or its components as described herein. For example, the operations of method 1700 may be performed by a communications manager as described with reference to FIGS. 6 through 9. In some examples, a UE may execute a set of instructions to control the functional elements of the UE to perform the functions described below. Additionally or alternatively, a UE may perform aspects of the functions described below using special-purpose hardware.

At 1705, the UE may receive an input signal from a transmitting device. The operations of 1705 may be performed according to the methods described herein. In some examples, aspects of the operations of 1705 may be performed by an input signal receiver as described with reference to FIGS. 6 through 9.

At 1710, the UE may identify, from the received input signal, a set of PRBs corresponding to one or more code blocks. The operations of 1710 may be performed according to the methods described herein. In some examples, aspects of the operations of 1710 may be performed by a PRB identifier as described with reference to FIGS. 6 through 9.

At 1715, the UE may determine a quantity of PRBs of the set of PRBs. The operations of 1715 may be performed according to the methods described herein. In some examples, aspects of the operations of 1715 may be performed by a deinterleaving matrix manager as described with reference to FIGS. 6 through 9.

At 1720, the UE may generate the irregular deinterleaving matrix based on the determined quantity of PRBs. The operations of 1720 may be performed according to the methods described herein. In some examples, aspects of the operations of 1720 may be performed by a deinterleaving matrix manager as described with reference to FIGS. 6 through 9.

At 1725, the UE may map, for each PRB of the set of PRBs, the PRB to one of a set of VRBs according to an irregular deinterleaving matrix to generate deinterleaved code blocks. The operations of 1725 may be performed according to the methods described herein. In some examples, aspects of the operations of 1725 may be performed by a VRB mapping component as described with reference to FIGS. 6 through 9.

It should be noted that the methods described herein describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE, LTE-A, and LTE-A Pro are releases of UMTS that use E-UTRA. UTRA, E-UTRA, UMTS, LTE, LTE-A, LTE-A Pro, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned herein as well as other systems and radio technologies. While aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR applications.

A macro cell generally covers a relatively large geographic area (e.g., several kilometers in radius) and may allow unrestricted access by UEs with service subscriptions with the network provider. A small cell may be associated with a lower-powered base station, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA, or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication at a receiving device, comprising:
   receiving an input signal from a transmitting device;
   receiving, from the transmitting device, an indication of an irregular deinterleaving matrix;
   identifying, from the received input signal, a set of physical resource blocks corresponding to one or more code blocks;
   concatenating a regular matrix and a vector to generate the irregular deinterleaving matrix based at least in part on a quantity of physical resource blocks of the set of physical resource blocks;
   identifying a plurality of indices corresponding to a plurality of entries of the irregular deinterleaving matrix written according to a row-first order; and
   mapping, for each physical resource block of the set of physical resource blocks, a respective physical resource block to one of a set of virtual resource blocks according to the irregular deinterleaving matrix and the plurality of indices to generate deinterleaved code blocks.

2. The method of claim 1, further comprising:
   determining the quantity of physical resource blocks of the set of physical resource blocks, wherein concatenating the regular matrix and the vector to generate the irregular deinterleaving matrix is based at least in part on the determined quantity of physical resource blocks, and wherein the regular matrix corresponds to a first portion of physical resource blocks of the set of physical resource blocks, and the vector corresponds to a remaining portion of physical resource blocks of the set of physical resource blocks.

3. The method of claim 2, wherein:
   the regular matrix comprises a first number of rows and a first number of columns; and
   the vector comprises a single column and a second number of rows less than the first number of rows.

4. The method of claim 2, wherein:
   the regular matrix comprises a first number of rows and a first number of columns; and
   the vector comprises a single column and a second number of rows.

5. The method of claim 1, further comprising:
   identifying a first index corresponding to a first entry of the irregular deinterleaving matrix associated with a first physical resource block, wherein the first physical resource block is mapped to one of the set of virtual resource blocks based at least in part on the first index.

6. The method of claim 1, wherein the set of physical resource blocks corresponds to resources allocated to the receiving device.

7. The method of claim 1, wherein:
   the set of virtual resource blocks comprises one or more resource block bundles, each resource block bundle comprising a plurality of virtual resource blocks of the set of virtual resource blocks; and
   a quantity of resource block bundles of the set of virtual resource blocks and a quantity of entries in the irregular deinterleaving matrix are a same quantity.

8. The method of claim 1, further comprising:
   receiving, from the transmitting device, a radio resource control parameter indicating that the transmitting device uses irregular interleaver mapping.

9. A method for wireless communication at a transmitting device, comprising:
   identifying a set of virtual resource blocks corresponding to one or more code blocks to be transmitted to a receiving device;
   concatenating a regular matrix and a vector to generate an irregular interleaving matrix based at least in part on a quantity of virtual resource blocks of the set of virtual resource blocks;
   identifying a plurality of indices corresponding to a plurality of entries of the irregular interleaving matrix written according to a row-first order;
   mapping, for each virtual resource block of the set of virtual resource blocks, a respective virtual resource block to one of a set of physical resource blocks according to the irregular interleaving matrix and the plurality of indices to generate interleaved code blocks;
   transmitting, to the receiving device, an indication of the irregular interleaving matrix; and
   transmitting an output signal to the receiving device based at least in part on the interleaved code blocks.

10. The method of claim 9, further comprising:
    determining the quantity of virtual resource blocks of the set of virtual resource blocks, wherein concatenating the regular matrix and the vector to generate the irregular interleaving matrix is based at least in part on the determined quantity, and wherein the regular matrix corresponds to a first portion of virtual resource blocks of the set of virtual resource blocks, and the vector corresponds to a remaining portion of virtual resource blocks of the set of virtual resource blocks.

11. The method of claim 10, wherein:
    the regular matrix comprises a first number of rows and a first number of columns; and
    the vector comprises a single column and a second number of rows less than the first number of rows.

12. The method of claim 10, wherein:
    the regular matrix comprises a first number of rows and a first number of columns; and
    the vector comprises a single column and a second number of rows.

13. The method of claim 9, further comprising:
    identifying a first index corresponding to a first entry of the irregular interleaving matrix associated with a first virtual resource block, wherein the first virtual resource block is mapped to one of the set of physical resource blocks based at least in part on the first index.

14. The method of claim 9, wherein the set of physical resource blocks corresponds to resources allocated to the receiving device.

15. The method of claim 9, wherein:
the set of virtual resource blocks comprises one or more resource block bundles, each resource block bundle comprising a plurality of virtual resource blocks of the set of virtual resource blocks; and
a quantity of resource block bundles of the set of virtual resource blocks and a quantity of entries in the irregular interleaving matrix are a same quantity.

16. The method of claim 9, further comprising:
transmitting, to the receiving device, a radio resource control parameter indicating that the transmitting device uses interleaver mapping.

17. An apparatus for wireless communication at a receiving device, comprising:
one or more processors,
one or more memories coupled with the one or more processors; and
instructions stored in the one or more memories and executable by the one or more processors to cause the apparatus to:
receive an input signal from a transmitting device;
identify, from the received input signal, a set of physical resource blocks corresponding to one or more code blocks;
receive, from the transmitting device, an indication of an irregular deinterleaving matrix;
concatenate a regular matrix and a vector to generate the irregular deinterleaving matrix based at least in part on a quantity of physical resource blocks of the set of physical resource blocks;
identify a plurality of indices corresponding to a plurality of entries of the irregular deinterleaving matrix written according to a row-first order; and
map, for each physical resource block of the set of physical resource blocks, a respective physical resource block to one of a set of virtual resource blocks according to the irregular deinterleaving matrix and the plurality of indices to generate deinterleaved code blocks.

18. The apparatus of claim 17, wherein the instructions are further executable by the one or more processors to cause the apparatus to:
determine the quantity of physical resource blocks of the set of physical resource blocks, wherein concatenating the regular matrix and the vector to generate the irregular deinterleaving matrix is based at least in part on the determined quantity of physical resource blocks, and wherein the regular matrix corresponds to a first portion of physical resource blocks of the set of physical resource blocks, and the vector corresponds to a remaining portion of physical resource blocks of the set of physical resource blocks.

19. The apparatus of claim 17, wherein the instructions are further executable by the one or more processors to cause the apparatus to:
identify a first index corresponding to a first entry of the irregular deinterleaving matrix associated with a first physical resource block, wherein the first physical resource block is mapped to one of the set of virtual resource blocks based at least in part on the first index.

20. An apparatus for wireless communication at a transmitting device, comprising:
one or more processors,
one or more memories coupled with the one or more processors; and
instructions stored in the one or more memories and executable by the one or more processors to cause the apparatus to:
identify a set of virtual resource blocks corresponding to one or more code blocks to be transmitted to a receiving device;
concatenate a regular matrix and a vector to generate an irregular interleaving matrix based at least in part on a quantity of virtual resource blocks of the set of virtual resource blocks;
identify a plurality of indices corresponding to a plurality of entries of the irregular interleaving matrix written according to a row-first order;
map, for each virtual resource block of the set of virtual resource blocks, a respective virtual resource block to one of a set of physical resource blocks according to the irregular interleaving matrix and the plurality of indices to generate interleaved code blocks;
transmit, to the receiving device, an indication of the irregular interleaving matrix; and
transmit an output signal to the receiving device based at least in part on the interleaved code blocks.

21. The apparatus of claim 20, wherein the instructions are further executable by the one or more processors to cause the apparatus to:
determine the quantity of virtual resource blocks of the set of virtual resource blocks, wherein concatenating the regular matrix and the vector to generate the irregular interleaving matrix is based at least in part on the determined quantity of physical resource blocks, and wherein the regular matrix corresponds to a first portion of physical resource blocks of the set of physical resource blocks, and the vector corresponds to a remaining portion of physical resource blocks of the set of physical resource blocks.

22. The apparatus of claim 20, wherein the instructions are further executable by the one or more processors to cause the apparatus to:
identify a first index corresponding to a first entry of the irregular interleaving matrix associated with a first virtual resource block, wherein the first virtual resource block is mapped to one of the set of physical resource blocks based at least in part on the first index.

* * * * *